(12) United States Patent
Scarbrough et al.

(10) Patent No.: US 11,641,737 B2
(45) Date of Patent: May 2, 2023

(54) MEMORY ARRAY COMPRISING STRINGS OF MEMORY CELLS AND METHOD USED IN FORMING A MEMORY ARRAY COMPRISING STRINGS OF MEMORY CELLS

(71) Applicant: Micron Technology, Inc., Boise, ID (US)

(72) Inventors: Alyssa N. Scarbrough, Boise, ID (US); John D. Hopkins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 199 days.

(21) Appl. No.: 17/162,062

(22) Filed: Jan. 29, 2021

(65) Prior Publication Data

US 2022/0246628 A1   Aug. 4, 2022

(51) Int. Cl.
| | |
|---|---|
| H01L 27/11556 | (2017.01) |
| H01L 27/11582 | (2017.01) |
| H01L 21/48 | (2006.01) |
| H01L 23/522 | (2006.01) |
| G11C 5/06 | (2006.01) |

(52) U.S. Cl.
CPC .......... *H01L 27/11556* (2013.01); *G11C 5/06* (2013.01); *H01L 21/486* (2013.01); *H01L 23/5226* (2013.01); *H01L 27/11582* (2013.01)

(58) Field of Classification Search
None
See application file for complete search history.

(56) References Cited

U.S. PATENT DOCUMENTS

| | | |
|---|---|---|
| 10,236,301 B1 | 3/2019 | Howder et al. |
| 2010/0109072 A1 | 5/2010 | Kidoh et al. |
| 2010/0140685 A1 | 6/2010 | Kang et al. |
| 2011/0159645 A1 | 6/2011 | Pekny |
| 2015/0380418 A1 | 12/2015 | Zhang et al. |
| 2017/0179026 A1 | 6/2017 | Toyama et al. |
| 2018/0277567 A1 | 9/2018 | Nakamura et al. |

(Continued)

FOREIGN PATENT DOCUMENTS

| | | |
|---|---|---|
| KR | 10-2010-0066783 | 6/2010 |
| WO | WO PCT/US2022/011014 | 4/2022 |

OTHER PUBLICATIONS

U.S. Appl. No. 17/006,634, filed Aug. 28, 2020, by Hopkins et al.

*Primary Examiner* — Hsien Ming Lee
(74) *Attorney, Agent, or Firm* — Wells St. John P.S.

(57) ABSTRACT

A method used in forming a memory array comprising strings of memory cells comprises forming a stack comprising vertically-alternating first tiers and second tiers. The stack comprises laterally-spaced memory-block regions. Simultaneously, (a), (b), and (c) are formed, where (a): horizontally-elongated trenches into the stack laterally-between immediately-laterally-adjacent of the memory-block regions; (b): channel openings into the stack laterally-between the horizontally-elongated trenches; and (c): through-array-via (TAV) openings into the stack in a stair-step region. Intervening material is formed in the horizontally-elongated trenches, a channel-material string in individual of the channel openings, and conductive material in the TAV openings. Other aspects, including structure independent of method, are disclosed.

29 Claims, 25 Drawing Sheets

(56) References Cited

U.S. PATENT DOCUMENTS

| | | |
|---|---|---|
| 2019/0088671 A1 | 3/2019 | Greenlee et al. |
| 2020/0126974 A1 | 4/2020 | Liu et al. |
| 2020/0312868 A1 | 10/2020 | Xiao |
| 2020/0395381 A1 | 12/2020 | Yang et al. |
| 2020/0402992 A1 | 12/2020 | Otsu et al. |
| 2021/0384209 A1 | 12/2021 | Heo |
| 2022/0068959 A1* | 3/2022 | Billingsley ....... H01L 21/31111 |

* cited by examiner

MEMORY ARRAY COMPRISING STRINGS OF MEMORY CELLS AND METHOD USED IN FORMING A MEMORY ARRAY COMPRISING STRINGS OF MEMORY CELLS

TECHNICAL FIELD

Embodiments disclosed herein pertain to memory arrays comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between, A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos, 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Figure 1:
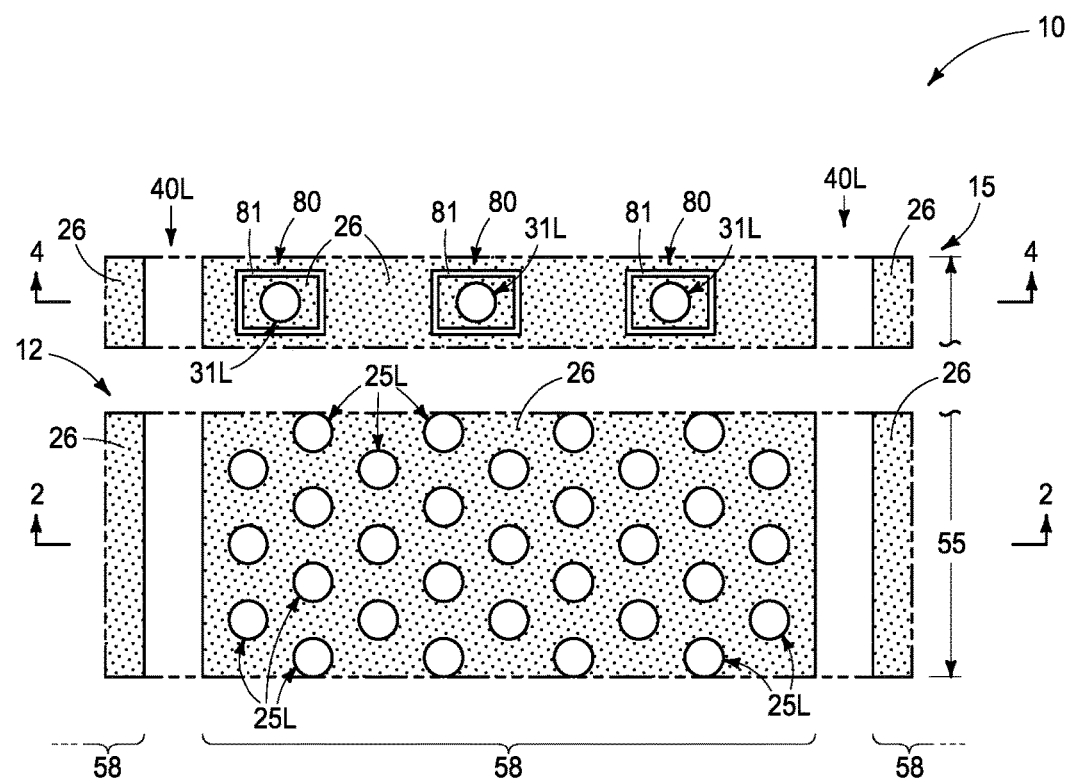
FIG. 1 is a diagrammatic cross-sectional view of a portion of a substrate in process in accordance with an embodiment of the invention and is taken through line 1-1 in FIG. 2.
Figure 2:
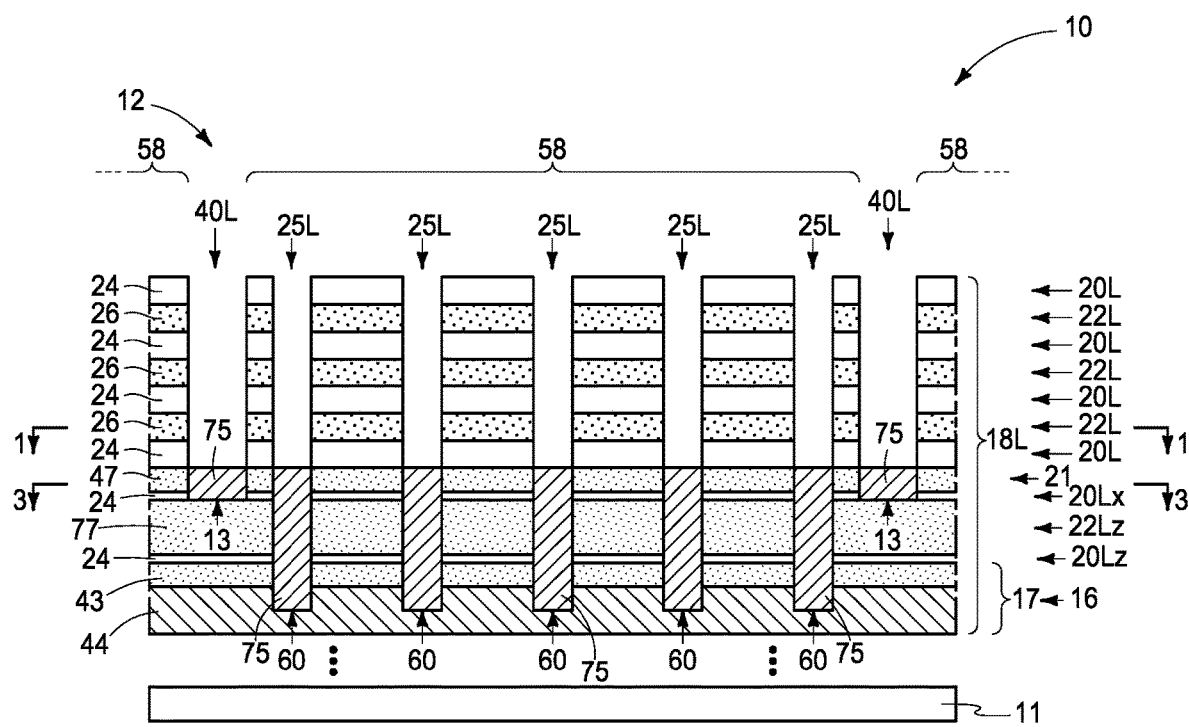
FIG. 2 is a diagrammatic cross-sectional view taken through line 2-2 in FIGS. 1 and 3.
Figure 3:
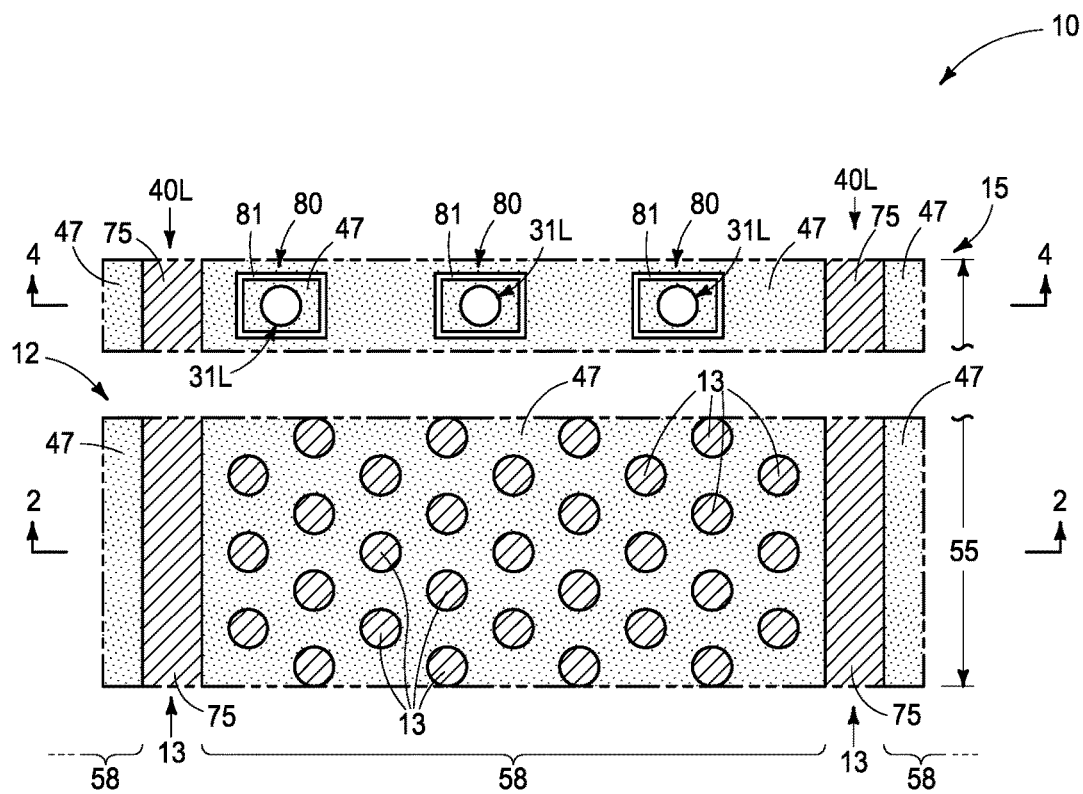
FIG. 3 is a diagrammatic cross-sectional view taken through line 3-3 in FIGS. 2 and 4.
Figure 4:
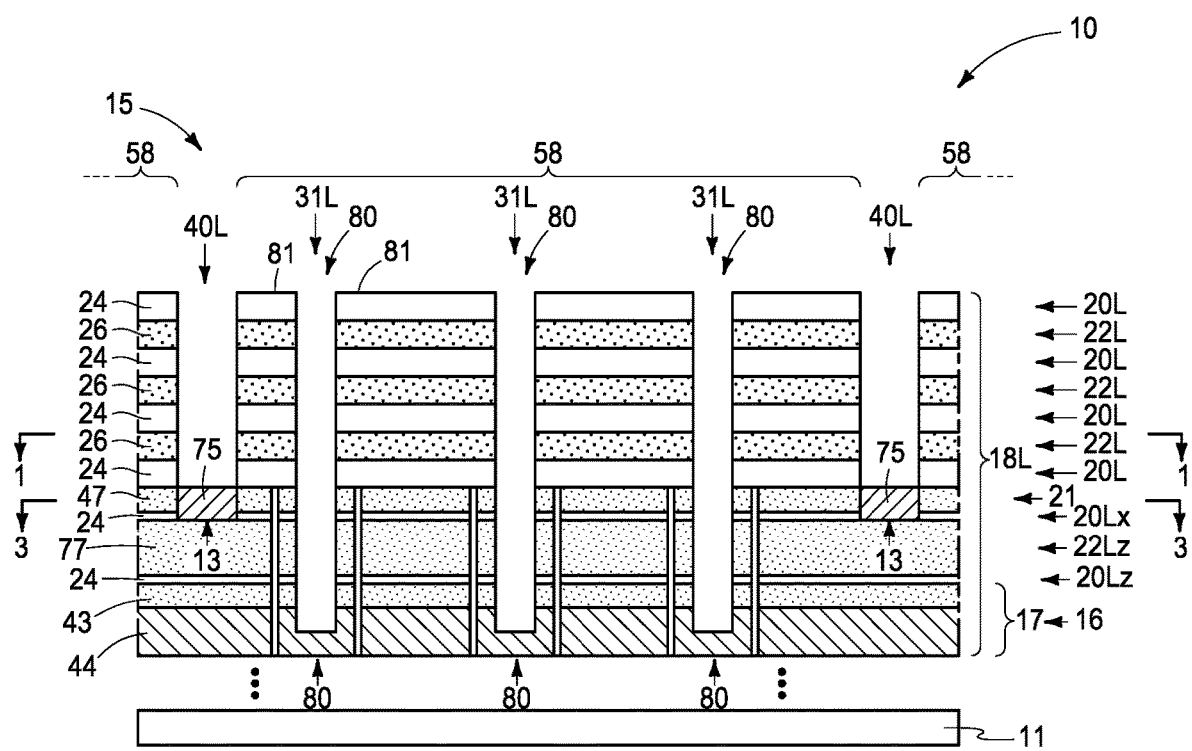
FIG. 4 is a diagrammatic cross-sectional view taken through line 4-4 in FIGS. 1 and 3

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-38 which may be considered as a "gate-last" or "replacement-gate" process, and starting with FIGS. 1-4.

FIGS. 1-4 show a construction 10 having an array or array area 12 in which elevationally-extending strings of transistors and/or memory cells will be formed. Construction 10 comprises a base substrate 11 having any one or more of conductive/conductor/conducting, semiconductive/semi-conductor/semiconducting, or insulative/insulator/insulating (i.e., electrically herein) materials. Various materials have been formed elevationally over base substrate 11. Materials may be aside, elevationally inward, or elevationally outward of the FIGS. 1-4-depicted materials. For example, other partially or wholly fabricated components of integrated circuitry may be provided somewhere above, about, or within base substrate 11, Control and/or other peripheral circuitry for operating components within an array (e.g., array 12) of elevationally-extending strings of memory cells may also be fabricated and may or may not be wholly or partially within an array, or sub-array. Further, multiple sub-arrays may also be fabricated and operated independently, in tandem, or otherwise relative one another. In this document, a "sub-array" may also be considered as an array.

In one embodiment, construction 10 comprises a stair-step region 15 in which a stair-step structure (not shown) may be formed, for example that may be in an end area of array 12 and away from area of array 12 in which the elevationally-extending strings of transistors and/or memory cells will be formed. Stair-step region 15 may or may not be considered as part of array 12. By way of example only, example stair-step region 15 is diagrammatically shown as having islands 80 and circumferentially about which insulator material 81 (e.g., $HfO_x$, $AlO_x$) is received. Islands 80 may be formed in one or more areas in which steps, stair-step-flight crests, and/or stair-step-flight landings will be formed (none of such being shown).

In some embodiments and as shown, a conductor tier 16 comprising conductor material 17 has been formed above substrate 11. As an example, conductor material 17 comprises upper conductor material 43 (e.g., n-type or p-type conductively-doped polysilicon) directly above (e.g., directly against) lower conductor material 44 (e.g., $WSi_x$) of different composition from upper conductor material 43, Conductor tier 16 may comprise part of control circuitry (e.g., peripheral-under-array circuitry and/or a common source line or plate) used to control read and write access to the transistors and/or memory cells that will be formed within array 12.

In some embodiments, conductor tier 16 may be considered as being part of a lower stack 18L comprising vertically-alternating lower insulative tiers 20L and lower conductive tiers 22L. Example lower stack 18L comprises laterally-spaced memory-block regions 58 that will comprise laterally-spaced memory blocks 58 in a finished circuitry construction. In this document, "block" is generic to include "sub-block", Memory-block regions 58 and resultant memory blocks 58 (not yet shown) may be considered as being longitudinally elongated horizontally, for example along a direction 55. Memory-block regions 58 may not be discernable prior to the processing shown by FIGS. 1-4.

Example thickness for each of lower tiers 20L and 22L is 22 to 60 nanometers. Only a small number of lower tiers 20L and 22L is shown, with more likely lower stack 18L comprising dozens, a hundred or more, etc. of lower tiers 20L and 22L. Other circuitry that may or may not be part of peripheral and/or control circuitry may be between conductor tier 16 and lower stack 18L. For example, multiple vertically-alternating tiers of conductive material and insulative material of such circuitry may be below a lowest of lower conductive tiers 22L and/or above an uppermost of lower conductive tiers 22L. For example, one or more select gate tiers (not shown) or dummy tiers (not shown) may be between conductor tier 16 and the lowest conductive tier 22L and one or more select gate tiers (not shown) or dummy tiers (not shown) may be above an uppermost of lower conductive tiers 22L. Alternately or additionally, at least one of the depicted lowest conductive tiers 22L may be a select gate tier. Regardless, lower conductive tiers 22L (alternately referred to as lower first tiers) may not comprise conducting material and lower insulative tiers 20L (alternately referred to as lower second tiers) may not comprise insulative material or be insulative at this point in processing in conjunction with the hereby initially-described example method embodiment which is "gate-last" or "replacement-gate". Example lower conductive tiers 22L. comprise first material 26 (e.g., silicon nitride) which may be wholly or partially sacrificial. Example lower insulative tiers 20L comprise second material 24 (e.g., silicon dioxide) that is of different composition from that of first material 26 and which may be wholly or partially sacrificial.

In one embodiment and as shown, a lowest lower second tier 20Lz lower stack 18L is directly above (e.g., directly against) conductor material 17. Tier 20Lz may be sacrificial. A lowest lower first tier 22Lz of lower stack 18L is directly above (e.g., directly against) tier 20Lz and comprises sacrificial material 77. Example sacrificial materials 77 include silicon nitride and doped or undoped polysilicon. In this document, "undoped polysilicon" is polysilicon having from 0 atoms/cm$^3$ to $1 \times 10^{12}$ atoms/cm$^3$ of atoms of conductivity-increasing impurity. "Doped polysilicon" is polysilicon that has more than $1 \times 10^{12}$ atoms/cm$^3$ of atoms of conductivity-increasing impurity and "conductively-doped polysilicon" is polysilicon that has at least $1 \times 10^{18}$ atoms/cm$^3$ of atoms of conductivity-increasing impurity. In one embodiment, a next-lowest lower second tier 20Lx is directly above tier 20Lz and a conducting-material tier 21 comprising conducting material 47 (e.g., conductively-doped polysilicon) is directly above tier 20Lx.

Processing with respect to (a), (b), and (c) has occurred simultaneously, where,
 (a): forming horizontally-elongated lower trenches 40L into lower stack 18L laterally-between immediately-laterally-adjacent memory-block regions 58;
 (b): forming lower channel openings 25L into lower stack 18L laterally-between horizontally-elongated lower trenches 40; and
 (c): forming lower through-array-via (TAV) openings 31L into the lower stack 18L in stair-step region 15.

Such may occur, for example, using photolithographic patterning and etch, and that may include pitch multiplication. Sacrificial horizontally-elongated lines 13 may have been previously formed in tier conducting-material tier 21 (and in one or more tiers there-below, or not). Example sacrificial lines 13 are individually between immediately-laterally-adjacent memory-block regions 58, and to which horizontally-elongated lower trenches 40l, have been formed. Sacrificial pillars 60 may also be formed and to which lower channel openings 25L have been formed. By way of example and for brevity only, pillars 60 and lower channel openings 25L are shown as being arranged in groups or columns of staggered rows of four and five per row. In one embodiment, pillars 60 and lines 13 comprise second sacrificial material 75.

Figure 5:
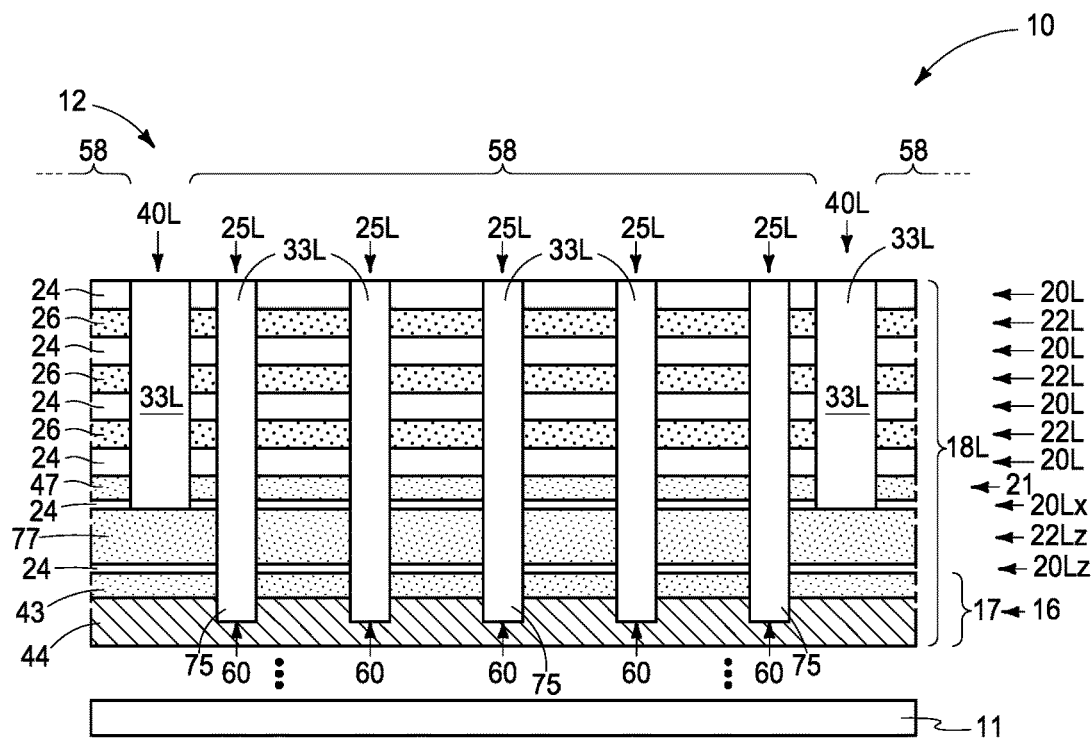
FIGS. 5-38 are diagrammatic seguential sectional, expanded, enlarged, and/or partial views of the construction of FIGS. 1-4, or portions thereof, in process in accordance with some embodiments of the invention.
Figure 6:
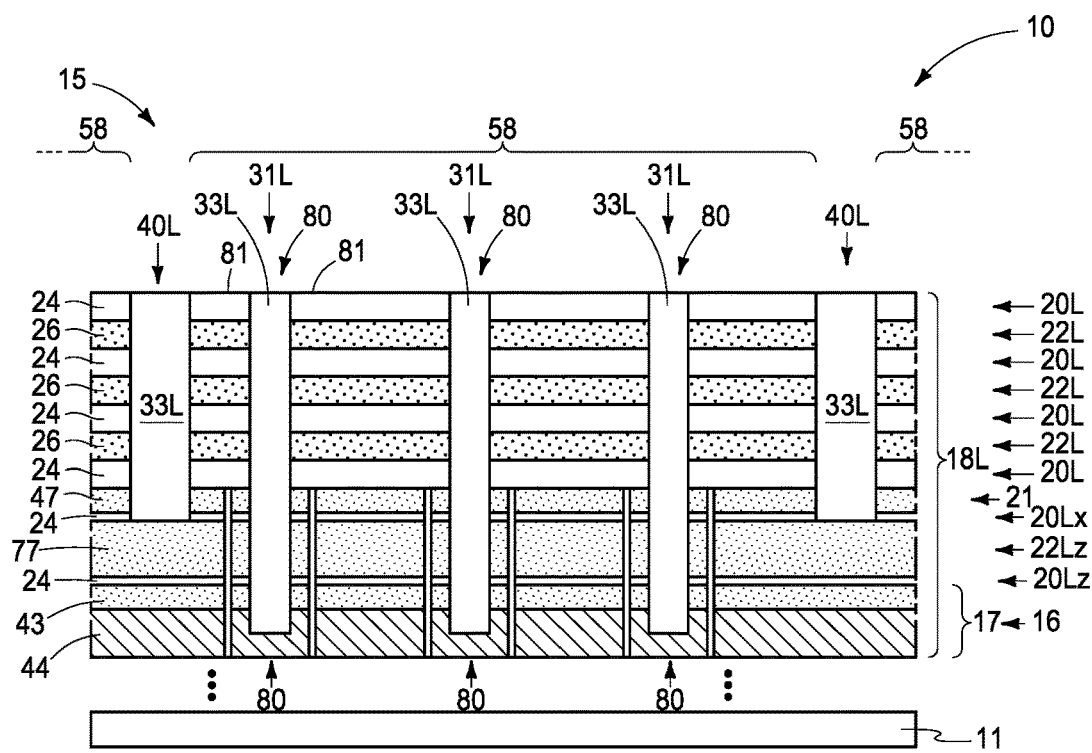

Referring to FIGS. 5 and 6, first sacrificial material 33L has been formed in that which was formed by the (a), the (b), and the (c) (e.g., 40L, 25L, and 31L). Optional lines 13 (not shown) and pillars 60 (not shown) have been removed prior to forming first sacrificial material 33L. First sacrificial material 33L may be of any composition and is ideally of a composition that may, be etched selectively relative to materials 24, 26, and 81.

Figure 7:
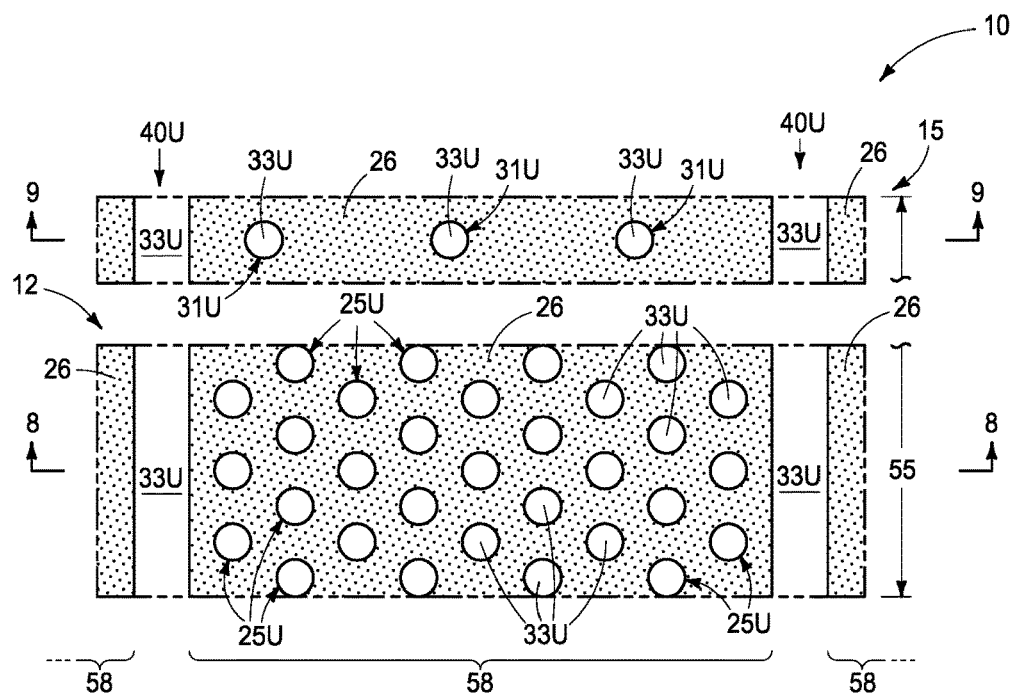
Figure 8:
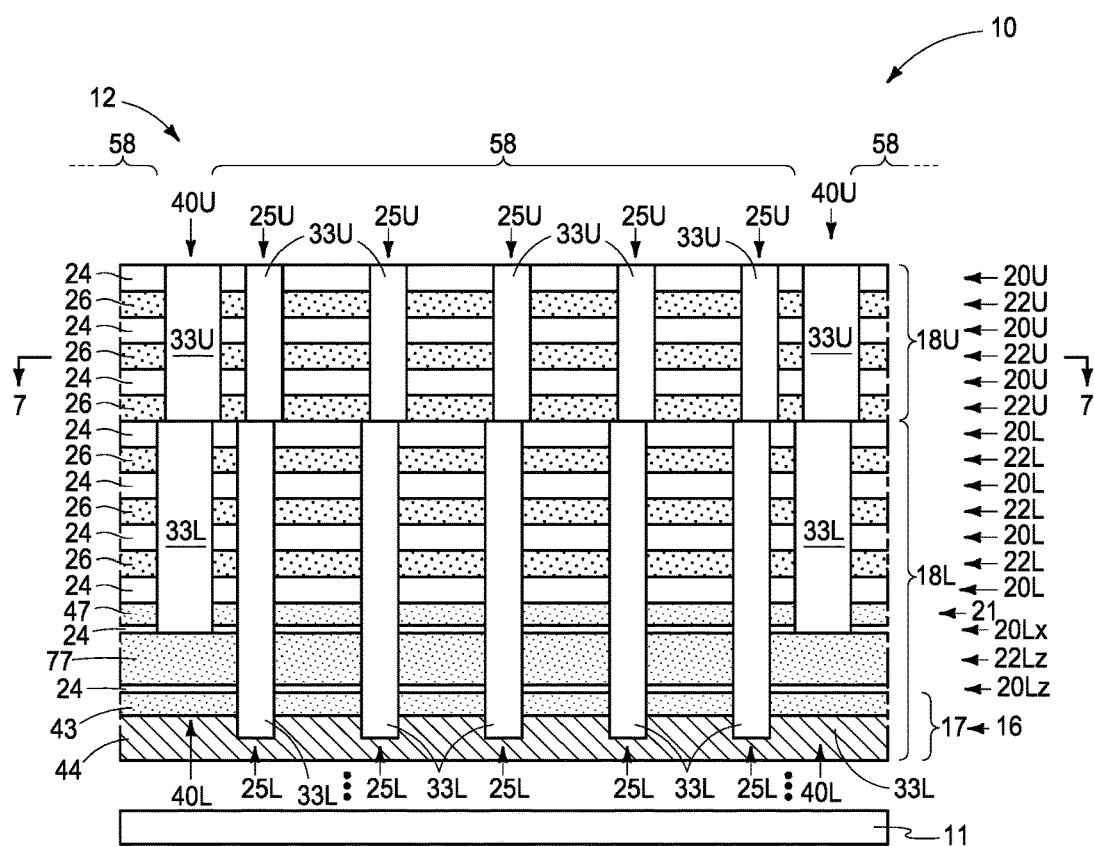
Figure 9:
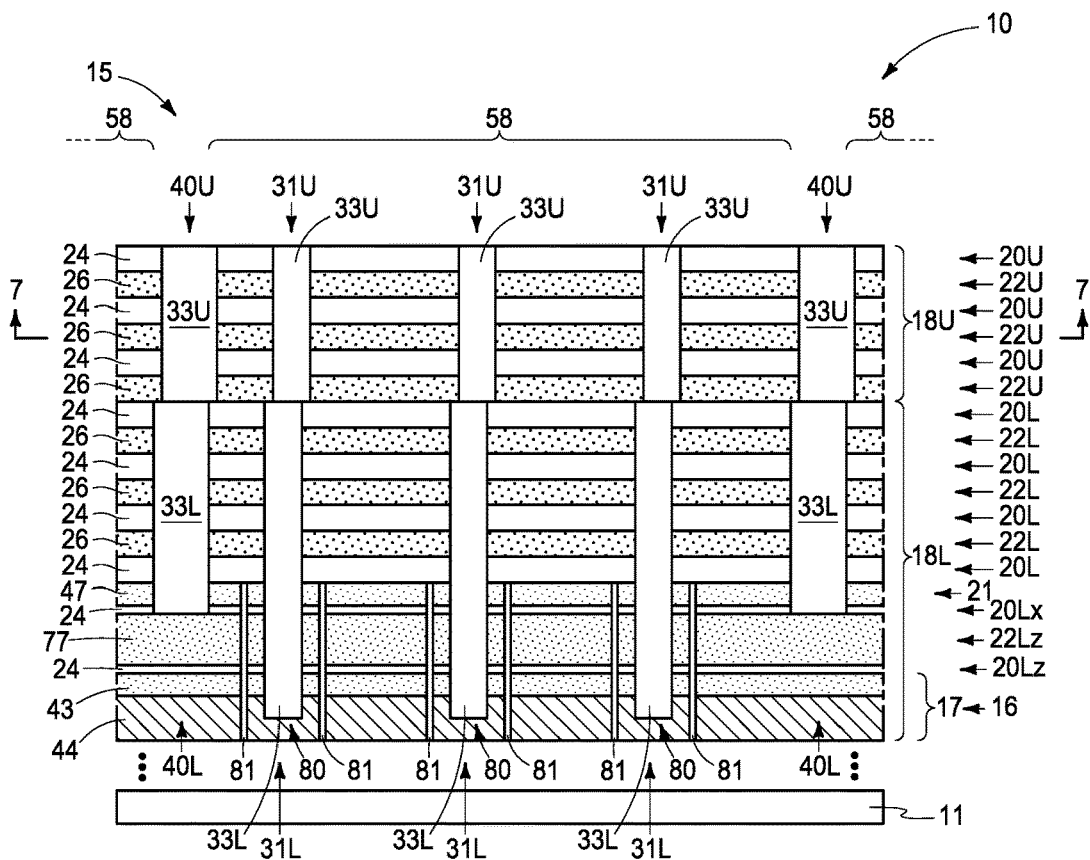

Referring to FIGS. 7-9, an upper stack 18U comprising vertically-alternating upper insulative tiers 20U (alternately referred to as upper second tiers) and upper conductive tiers 22U (alternately referred to as upper first tiers) has been formed directly above lower stack 18L, with upper and lower stacks 18U and 18L collectively comprising memory-block regions 58. Upper insulative tiers 20U and upper conductive tiers 22U may have any of the attributes described above with respect to lower insulative tiers 20L and lower conductive tiers 22L. Example upper insulative tiers 20U are shown as comprising second material 24 and upper conductive tiers 22U are shown as comprising first material 26, although other compositions may of course be used and not necessarily of the same composition as in lower stack 18L.

Processing with respect to (d (e), and (f) has occurred, where, (d): forming horizontally-elongated upper trenches 40U into upper stack 18U laterally-between immediately-laterally-adjacent memory-block regions 58 (individual horizontally-elongated upper trenches 40U extending to first sacrificial material 33L in individual horizontally-elongated lower trenches 40L);

(e): forming upper channel openings 25U into upper stack 18U laterally-between horizontally-elongated upper trenches 40U (individual upper channel openings 25U extending to first sacrificial material 33L in individual lower channel openings 25L); and (f): forming upper TAV openings 31U into upper stack 18L in stair-step region 15 (individual upper TAV openings 31U extending to first sacrificial material 33L in individual lower TAV openings 31L).

In one embodiment, the (d), the (e), and the (f) are formed simultaneously. In another embodiment, the (d), the (e), and the (f) are not formed simultaneously. In one such another embodiment, the (e) is formed before the forming of the (d) and the (f), and in one such latter embodiment the (f) is formed before the forming of the (d). Regardless, and thereafter, second sacrificial material 33U has been formed in that which was formed by the (d), the (e), and the (f) (e.g., 40U, 25U, and 31U). Second sacrificial material 33U may be of any composition and is ideally of a composition that may be etched selectively relative to materials 24 and 26. First sacrificial material 33L and second sacrificial material 33U may be of the same composition or of different compositions relative one another.

The first and second sacrificial materials are removed to form upwardly-open vertically-extended trenches, upwardly-open vertically-extended channel openings, and upwardly-open vertically-extended TAV openings. Intervening material is formed in the upwardly-open vertically-extended horizontally-elongated trenches, a channel-material string in individual of the upwardly-open vertically-extended channel openings, and conductive material in the upwardly-open vertically-extended TAV openings. An example embodiment of doing so is next described with reference to FIGS. 10-38.

Figure 10:
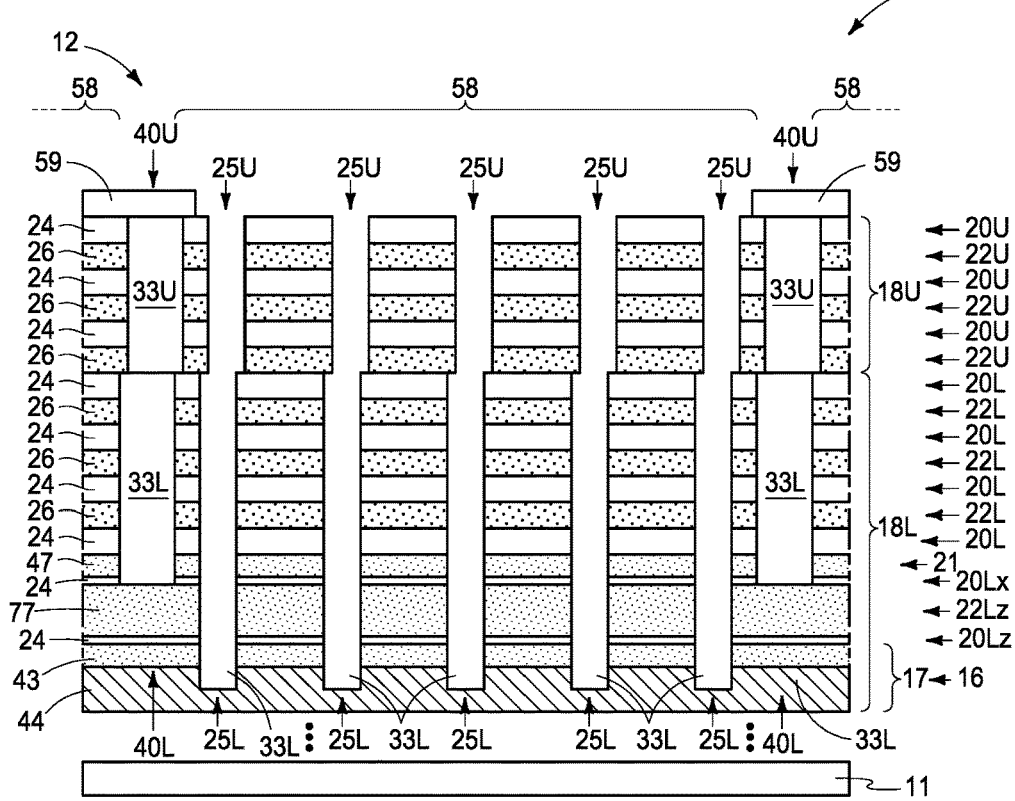
Figure 11:
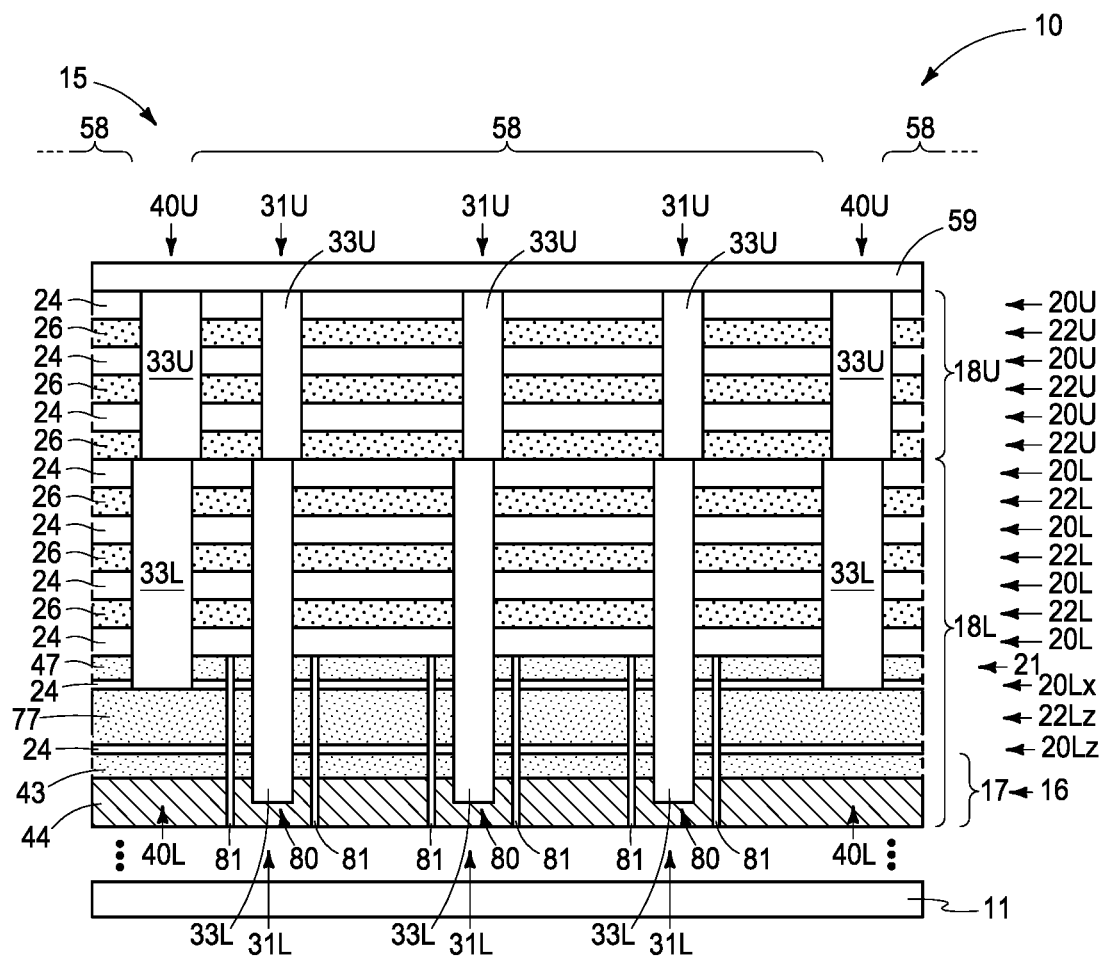
Figure 12:
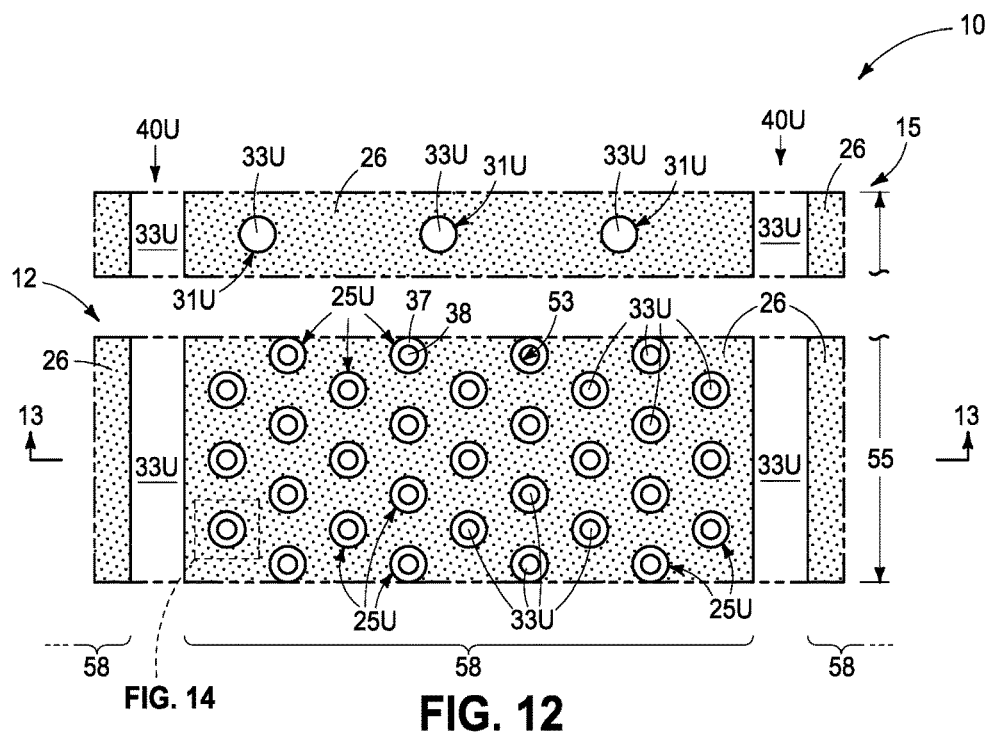
Figure 13:
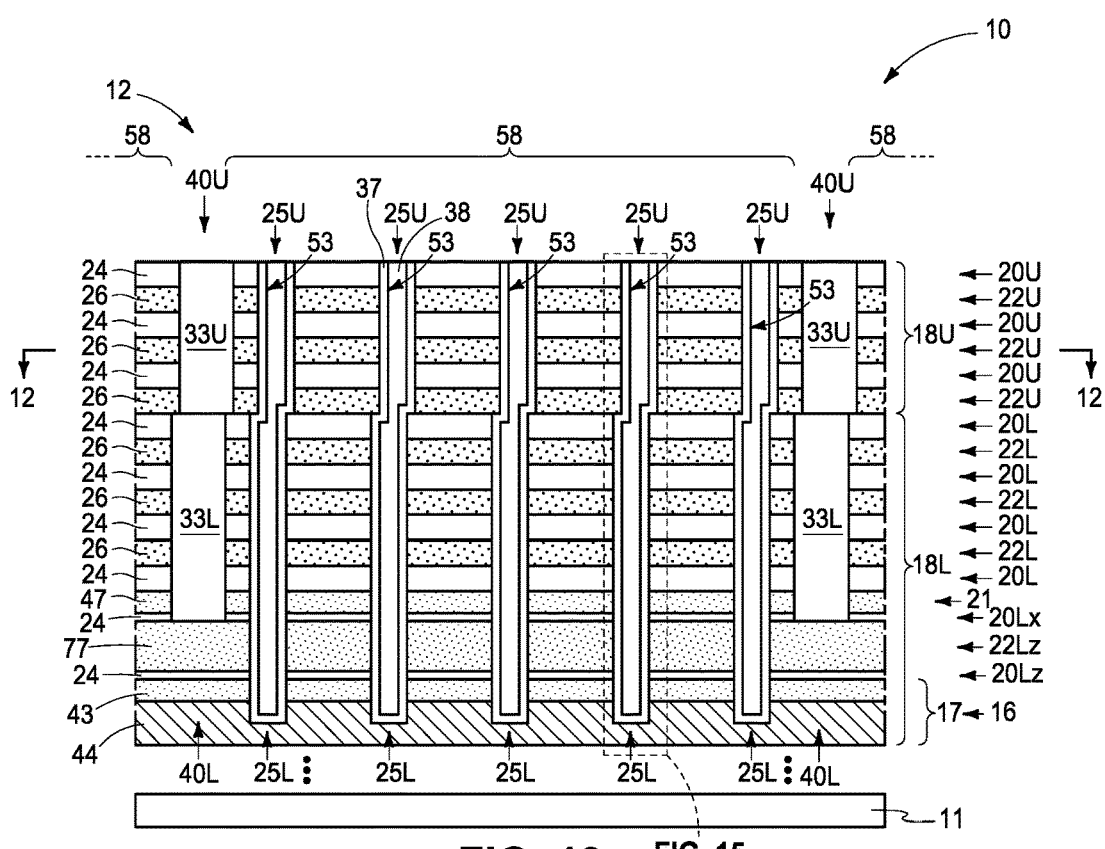
Figure 14:
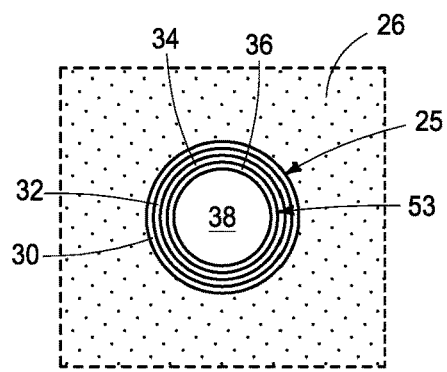
Figure 15:
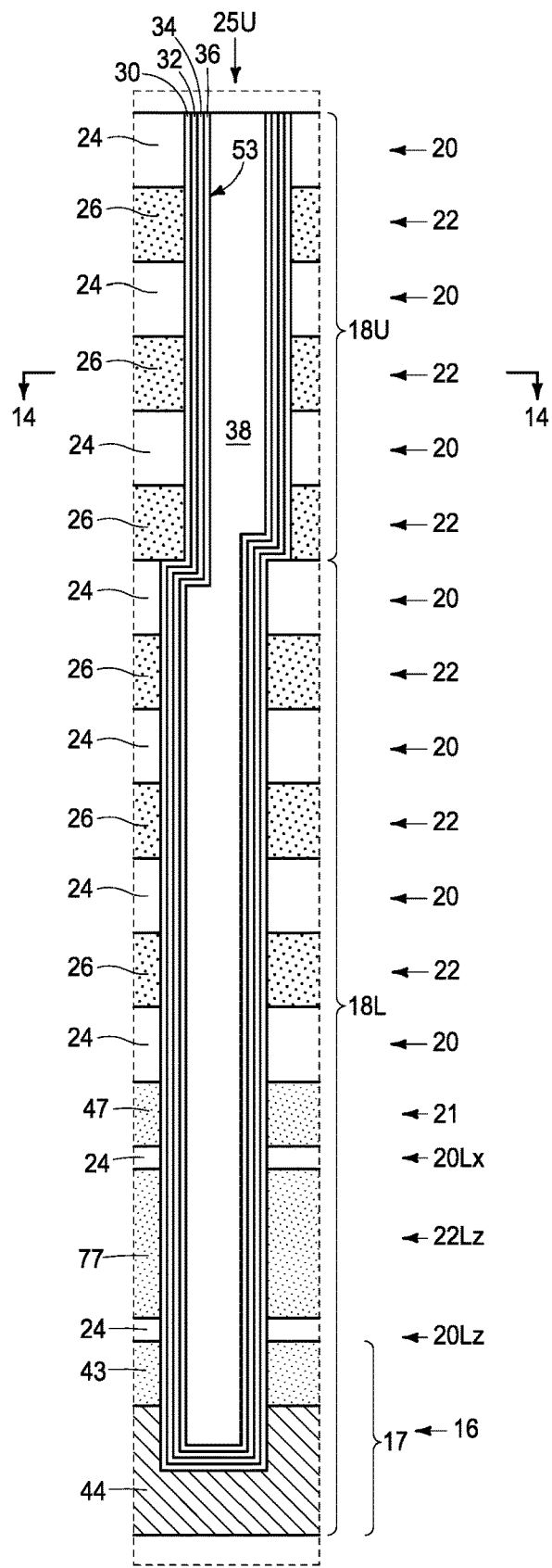
Figure 16:
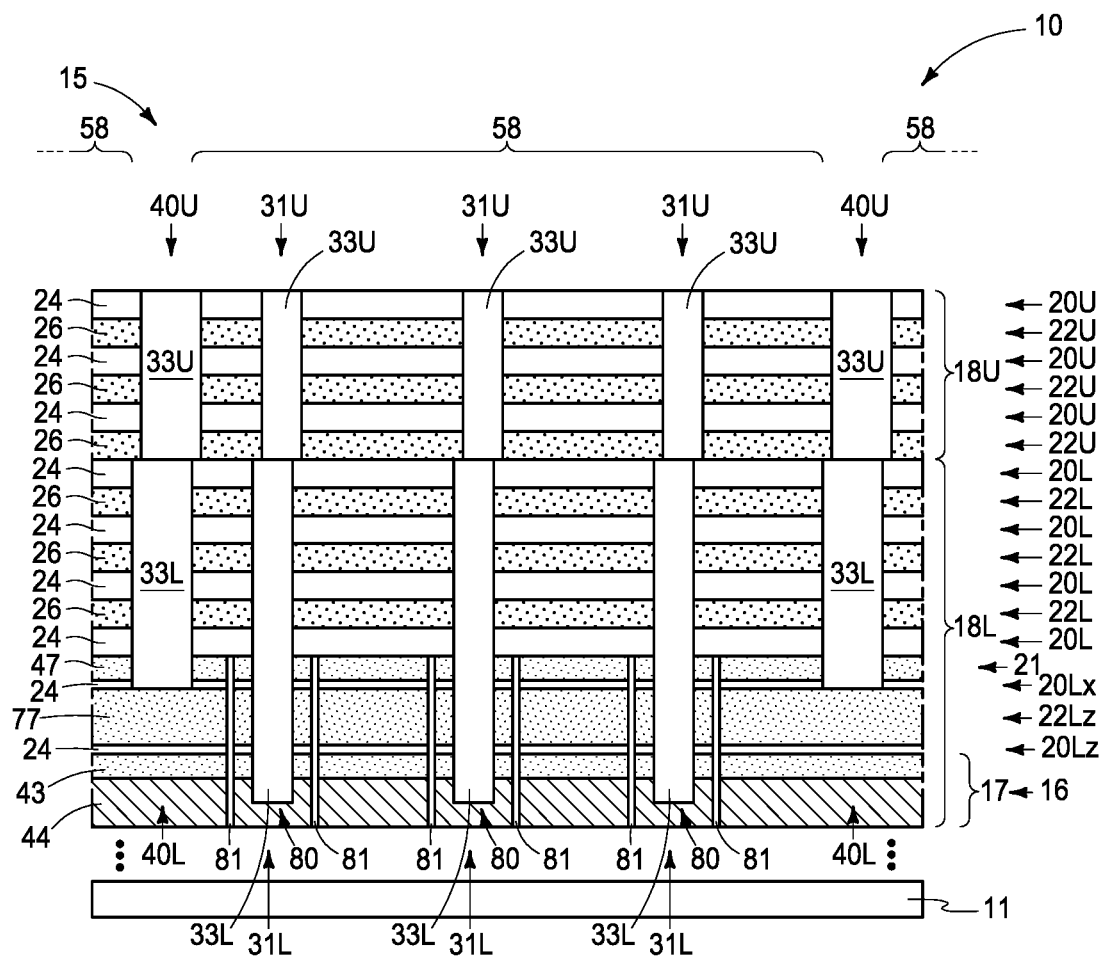

Referring to FIGS. 10 and 11, horizontally-elongated upper trenches 40U and upper TAV openings 31U (and second sacrificial material 33U therein) have been masked (e.g., with masking material 59 [e.g., silicon dioxide]). First sacrificial material 33L and second sacrificial material 33U have thereafter been removed from lower channel openings 25L and from upper channel openings 25U (33U and 33L thereby not being shown therein) to form upwardly-open vertically-extended channel openings 25U/25L.

Referring to FIGS. 12-16, individual channel-material strings 53 have been formed in individual of upwardly-open vertically-extended channel openings 25U/25L. For example, one embodiment is shown where charge-blocking material 30, storage material 32, charge-passage material 34, and channel material 36 (forming channel-material strings 53) have been formed in extended channel openings 25U/25L elevationally along insulative tiers 20U/20L and conductive tiers 22U/22L. Transistor materials 30, 32, and 34 (e.g., memory-cell materials) and channel material 36 may be formed by, for example, deposition of respective thin layers thereof over upper stack 18U and within individual extended channel openings 25U/25L followed by planarizing such back at least to a top surface of upper stack 18U. Remaining masking material 59 may be removed by such processing or subsequently (material 59 thereby not being shown in FIG. 13). Materials 30, 32, 34, and 36 are collectively shown as and only designated as material 37 in FIGS. 12 and 13 due to scale.

Example thickness for each of materials 30, 32, 34, and 36 is 25 to 100 Angstroms. Punch etching may be conducted to remove materials 30, 32, and 34 from the bases of lower channel openings 25 and trenches 40L (not shown) to expose conductor tier 16 such that channel material 36 is directly against conductor material 17 of conductor tier 16. Such punch etching may occur separately with respect to each of materials 30, 32, and 34 (not shown) or may occur with respect to only some (not shown). Alternately, and by way of example only, no punch etching may be conducted (none being shown) and channel material 36 may be directly electrically coupled to conductor material 17 of conductor tier 16 only by a separate conductive interconnect (not yet shown). Extended channel openings 25U/25L are shown as comprising a radially/longitudinally-central solid dielectric material 38 (e.g., spin-on-dielectric, silicon dioxide, and/or silicon nitride). Alternately, and by way of example only, the radially-central portion within extended channel openings 25U/25L may include void-space(s) (not shown) and/or be devoid of solid material (not shown). A conductive plug (e.g., conductively-doped polysilicon and/or metal material and not shown) may be radially inside of an uppermost portion of channel material 36 and atop dielectric material 38 there-below.

Figure 17:
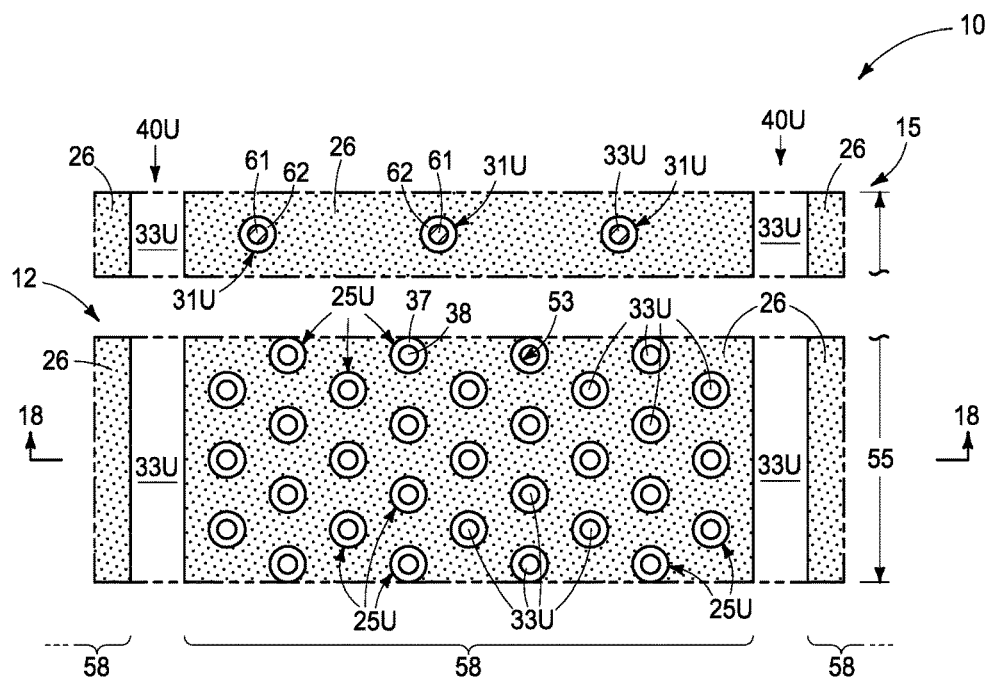
Figure 18:
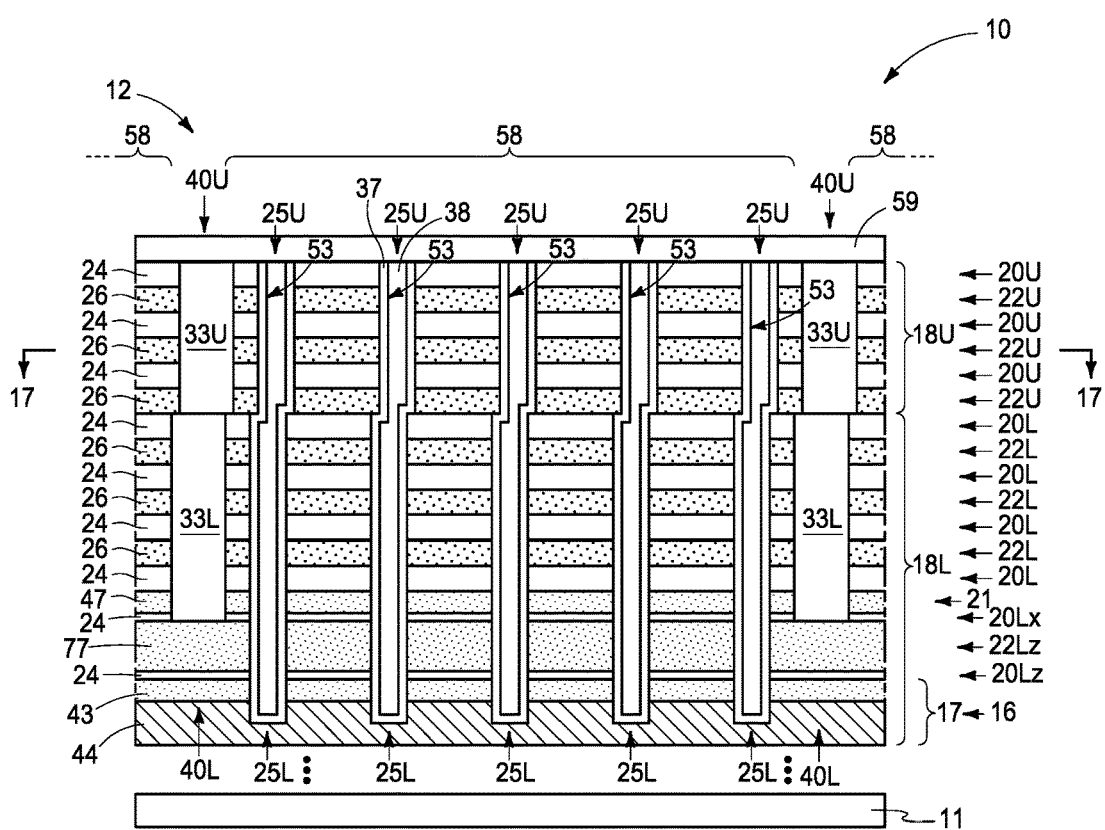
Figure 19:
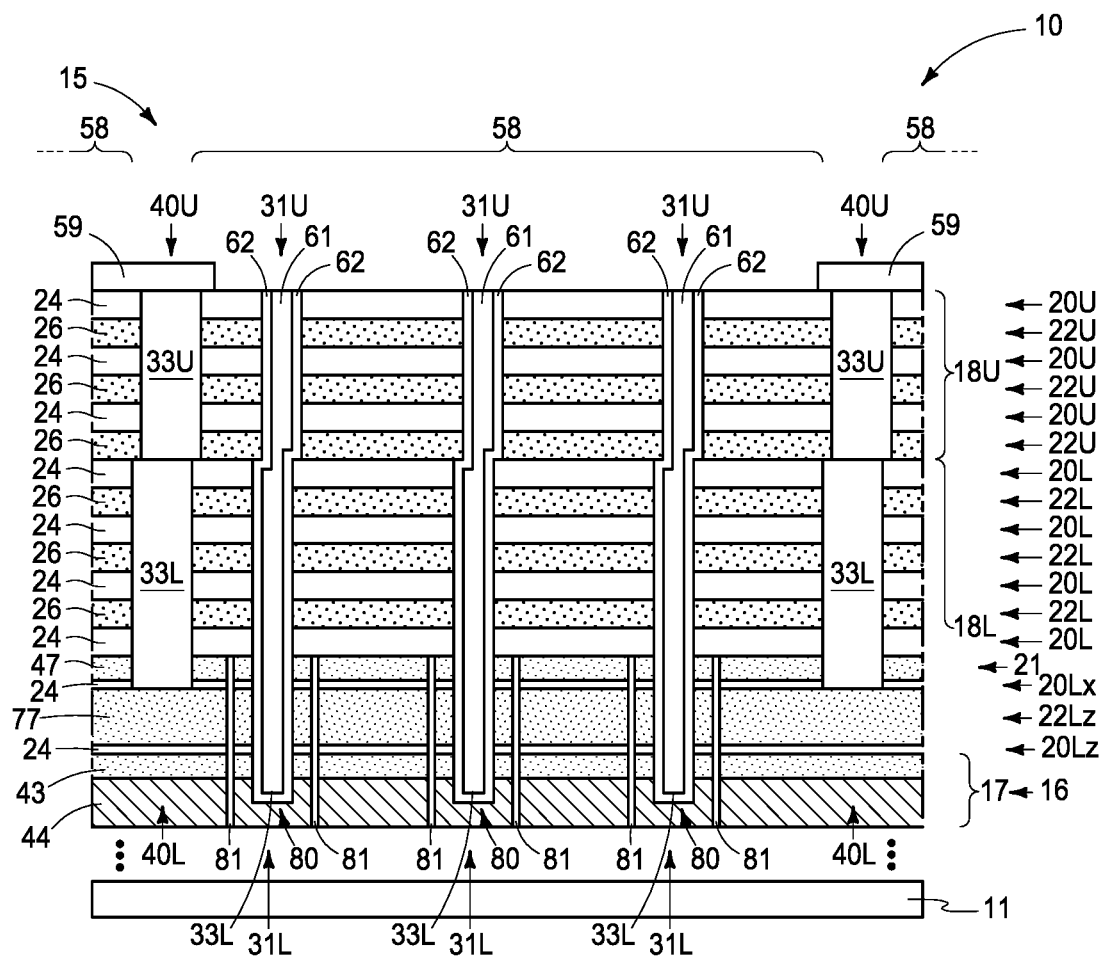

Referring to FIGS. 17-19, horizontally-elongated upper trenches 40l) and extended channel openings 25U/25L (and materials 37, 38 and 33U therein) have been masked (e.g., with masking material 59). First sacrificial material 33L and second sacrificial material 33U have thereafter been removed from lower TAV openings 31L and from upper TAV openings 31U (thereby not being shown therein) to form upwardly-open vertically-extended TAV openings 31U/31L, with conductive material 61 thereafter having been formed in individual of upwardly-open vertically-extended TAV openings 31U/31L. An insulative liner 62 (e.g., silicon dioxide) may be formed as shown prior to forming conductive material 61.

Figure 20:
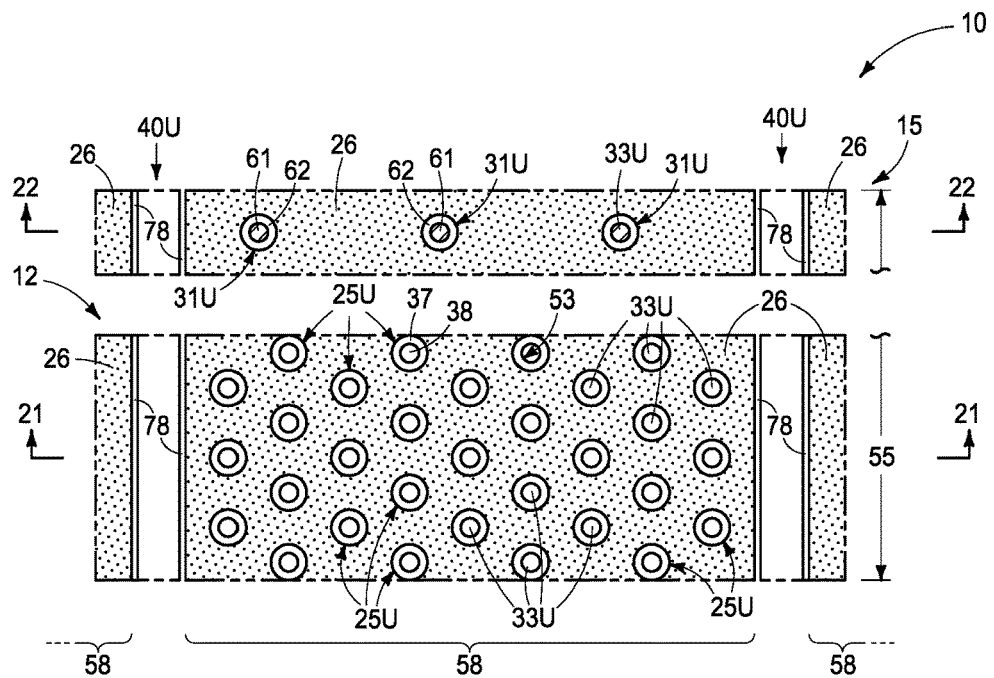
Figure 21:
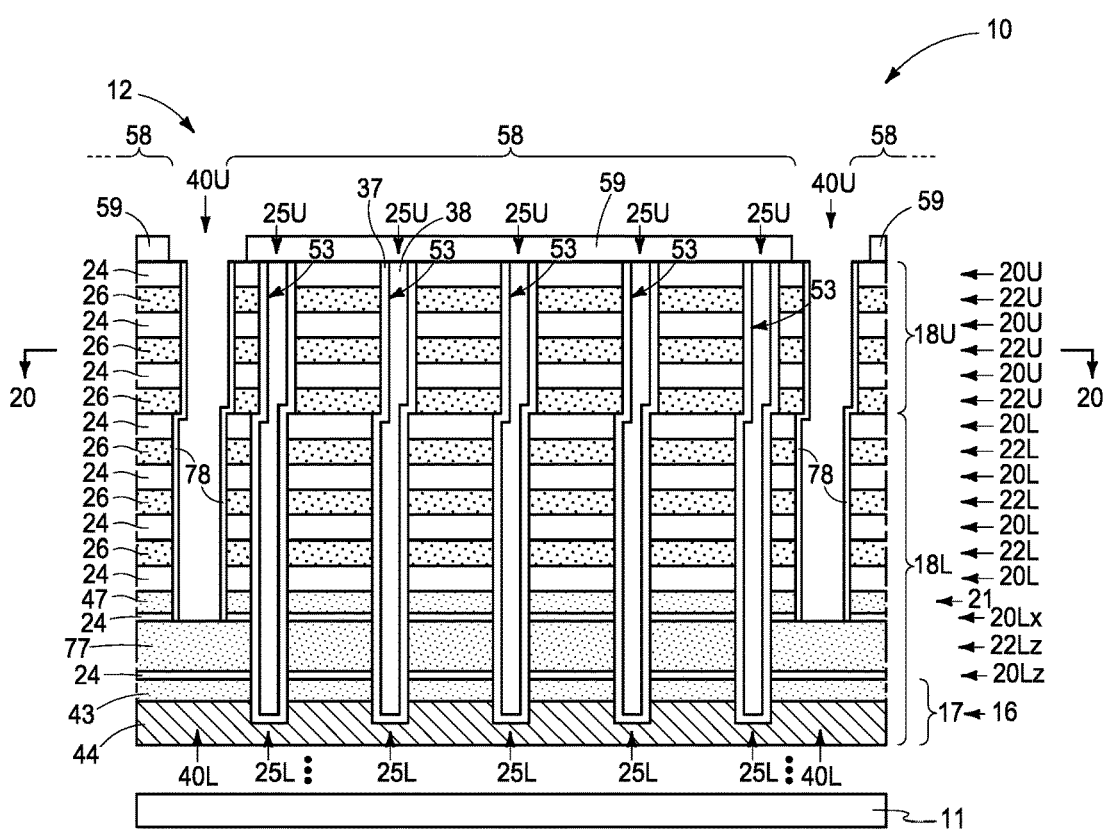
Figure 22:
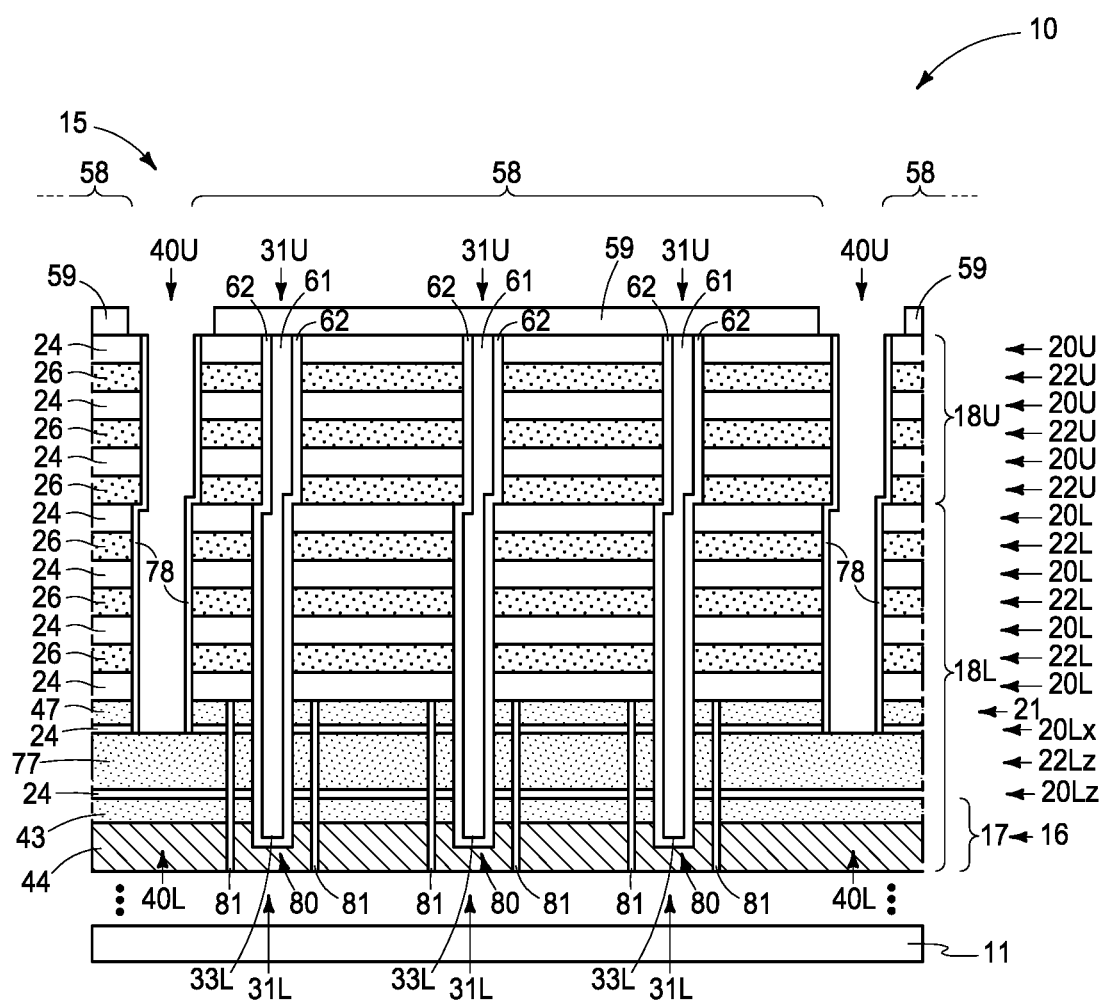

Referring to FIGS. 20-22, extended TAV openings 31U/31L and extended channel openings 25U/25L (and materials 61, 62, 37, and 38 therein) have been masked (e.g., with masking material 59). First sacrificial material 33L and second sacrificial material 33U have thereafter been removed from lower horizontally-elongated trench 40L and upper horizontally-elongated trench 40U (33L and 33U thereby not being shown therein), respectively, to form upwardly-open vertically-extended horizontally-elongated trenches 40U/40L. A thin sacrificial liner 78 (e.g., hafnium oxide, aluminum oxide, etc.), in one embodiment, may then be formed, followed by punch-etching there-through to expose sacrificial material 77, and then removal (not shown) of masking material 59.

As stated above, in some embodiments, the forming of horizontally-elongated upper trenches 40U, upper channel openings 25U, and upper TAV openings 31U does not occur simultaneously. As an example, and in one embodiment, upper channel openings 25U may be formed while regions where upper trenches 40U and upper TAV openings 31 will be are masked. Then, sacrificial material 33L can be removed from lower channel openings 25L. Extended channel openings 25U/25L resulting therefrom can then be filled with materials 30, 32, 34, 36, and 38. Analogous or other processing may then occur with respect to upper TAV openings 31U and upper trenches 401) simultaneously or separately.

Figure 23:
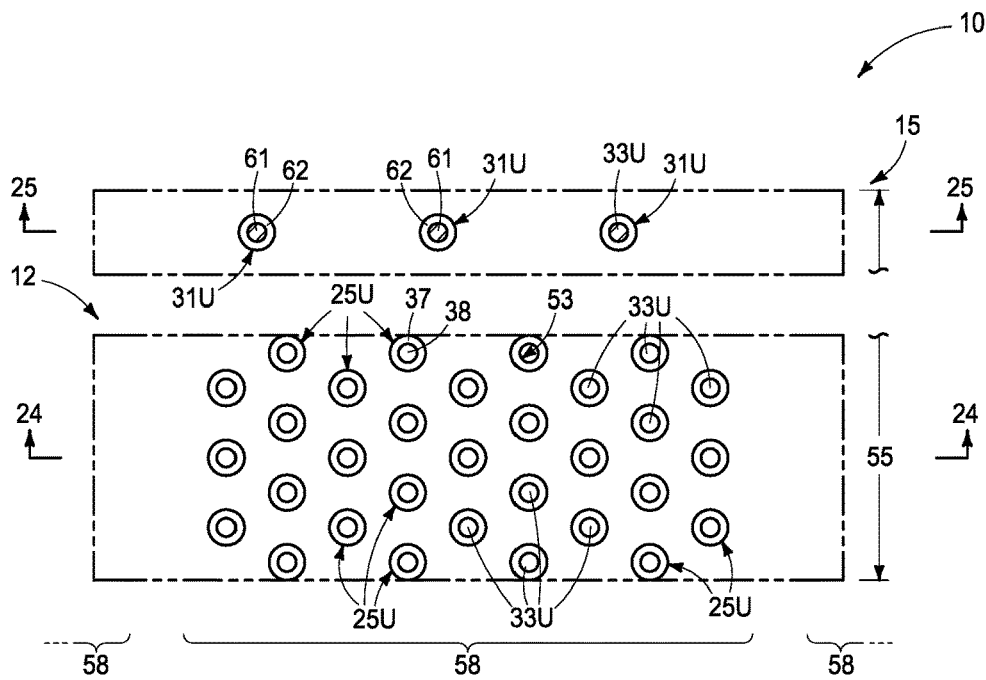
Figure 24:
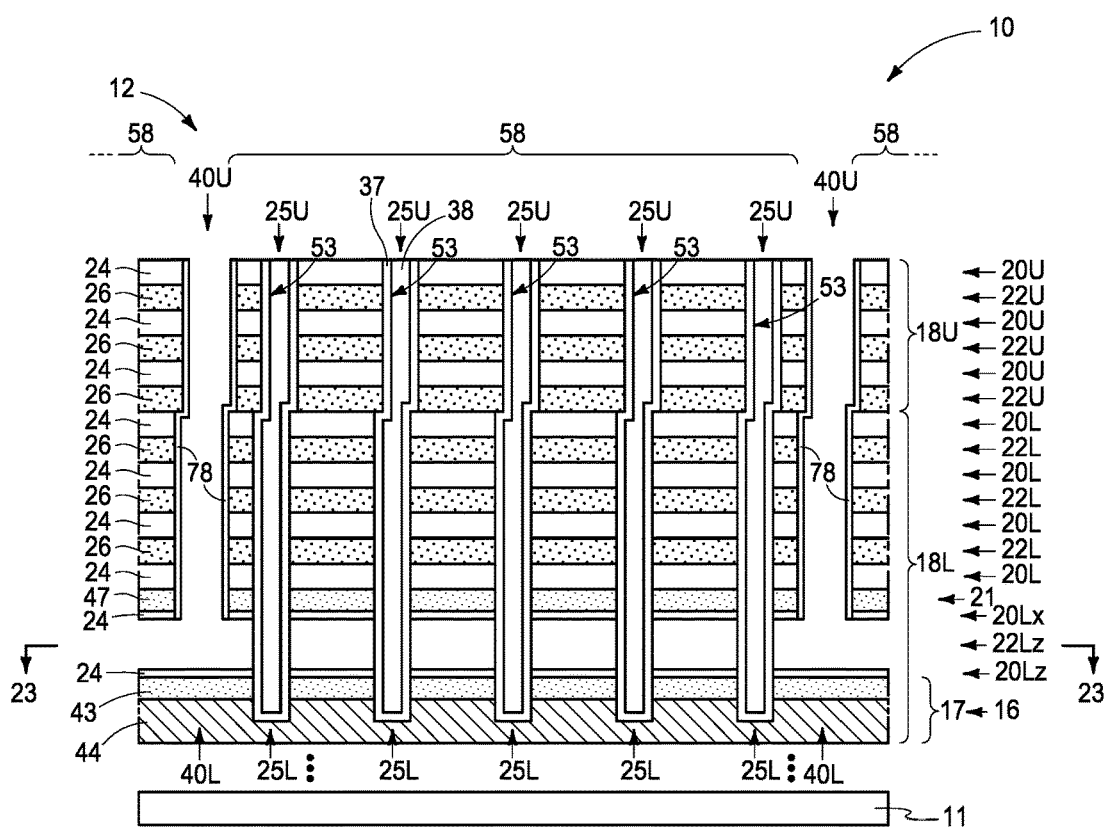
Figure 25:
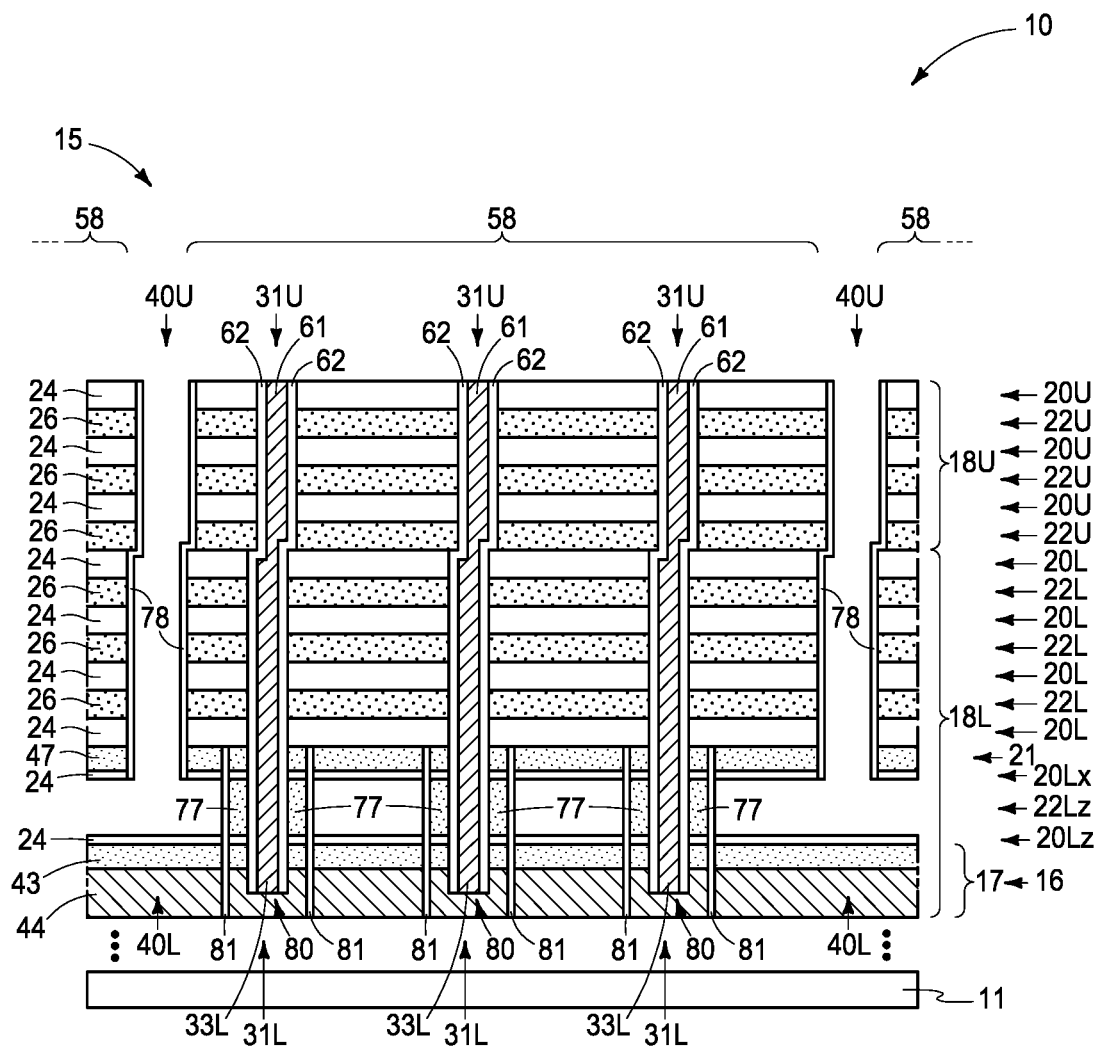

Referring to FIGS. 23-25, exposed sacrificial material 77 (not shown) has been isotropically etched (e.g., using $H_3PO_4$ where such comprises silicon nitride and using tetramethylammonium hydroxide where such comprises polysilicon) from lowest first tier 22z through trenches 40U/40L.

Figure 26:
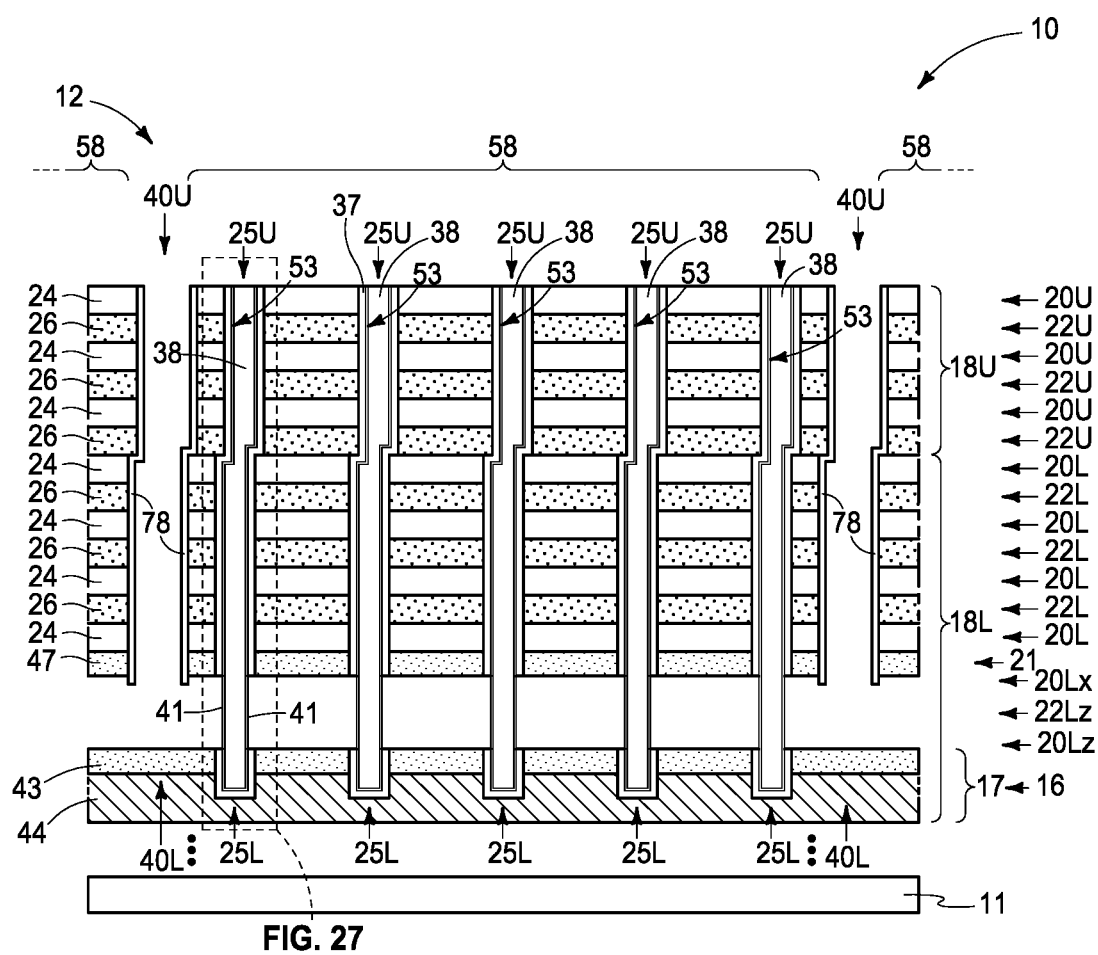
Figure 27:
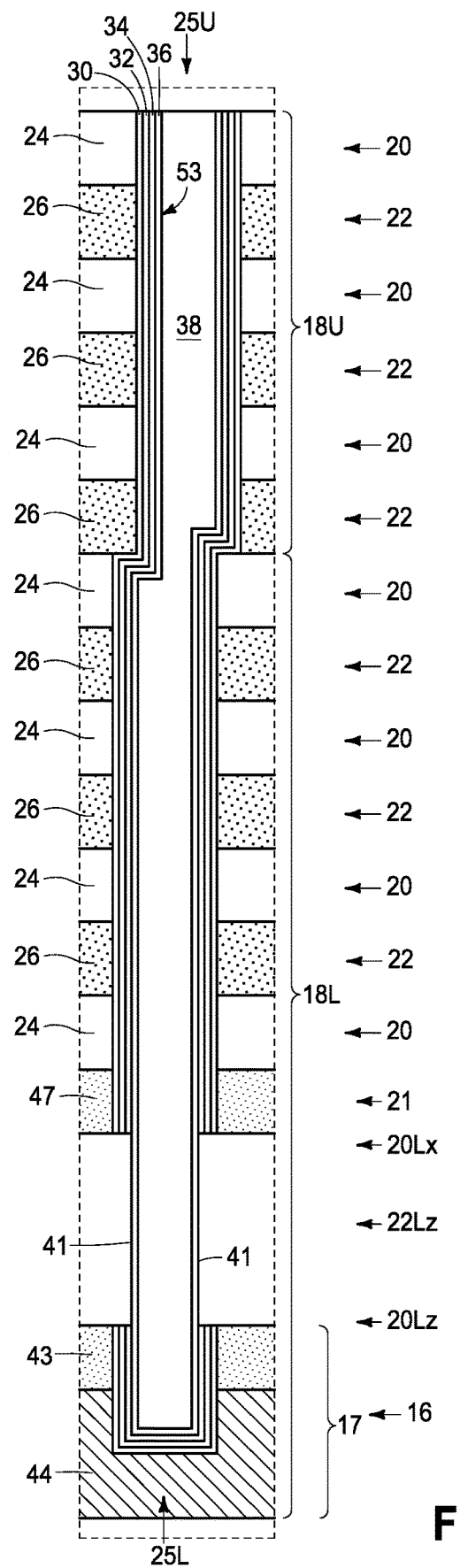

Conductive material is formed in the lowest first tier that directly electrically couples together the channel material of the individual channel-material strings and the conductor material of the conductor tier. In one embodiment, such conductive material is formed directly against a bottom of the conducting material of the conducting tier and directly against a top of the conductor material of the conductor tier. For example, and first referring to FIGS. 26 and 27, such show example subsequent processing wherein, in one embodiment, material 30 (e.g., silicon dioxide), material 32 (e.g., silicon nitride), and material 34 (e.g., silicon dioxide or a combination of silicon dioxide and silicon nitride) have been etched in tier 20z to expose a sidewall 41 of channel material 36 of channel-material strings 53 in lowest first tier 22z. Any of materials 30, 32, and 34 in tier 22z may be considered as being sacrificial material therein. As an example, consider an embodiment where liner 78 is one or more insulative oxides (other than silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example construction shown by FIGS. 26 and 27. The artisan is capable of selecting other chemistries for etching other different materials where a construction as shown in FIGS. 26 and 27 is desired. Some or all of insulative material (e.g., 24) from tiers 20Lx and 20Lz (when present, and material 24 not shown as having been removed) may be removed when removing other materials, may be removed separately, or may partially or wholly remain (not shown).

Figure 28:
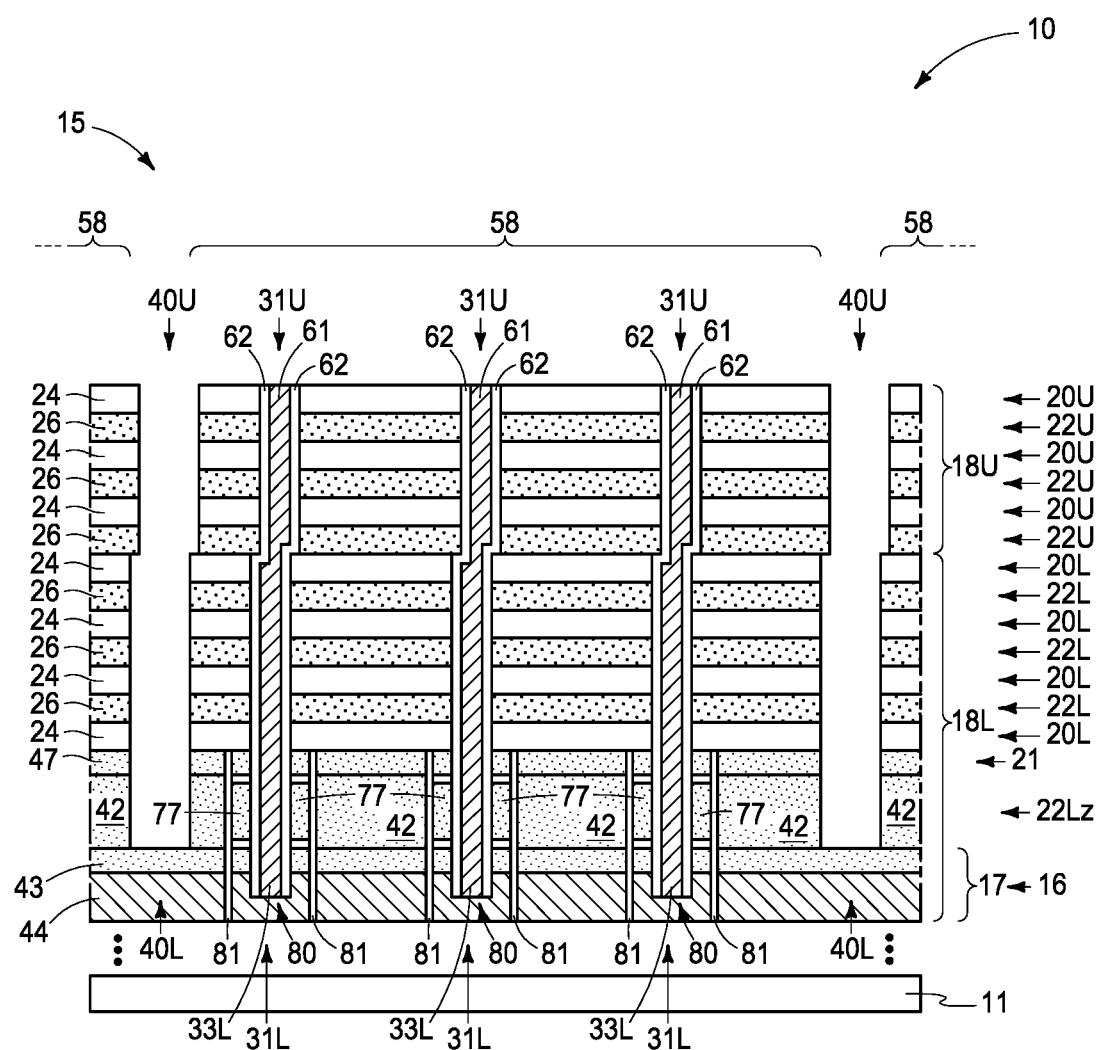
Figure 29:
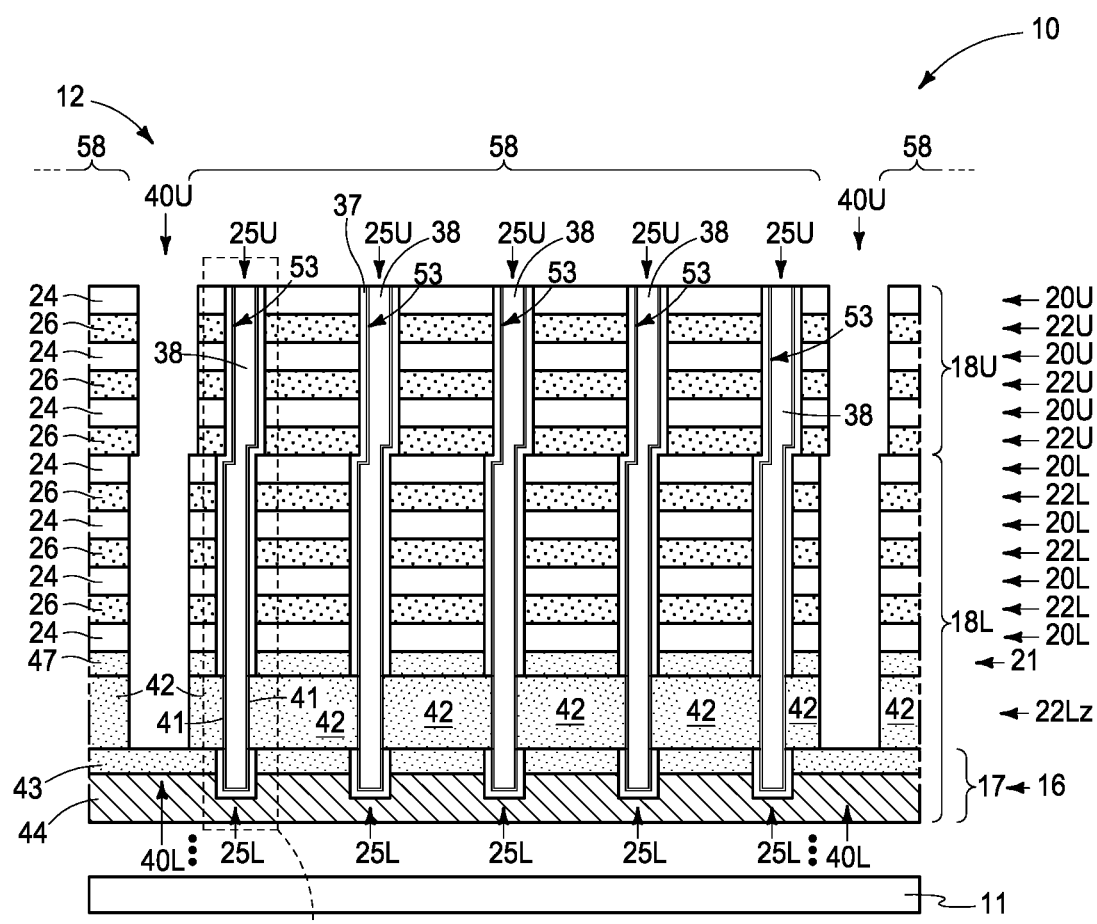
Figure 30:
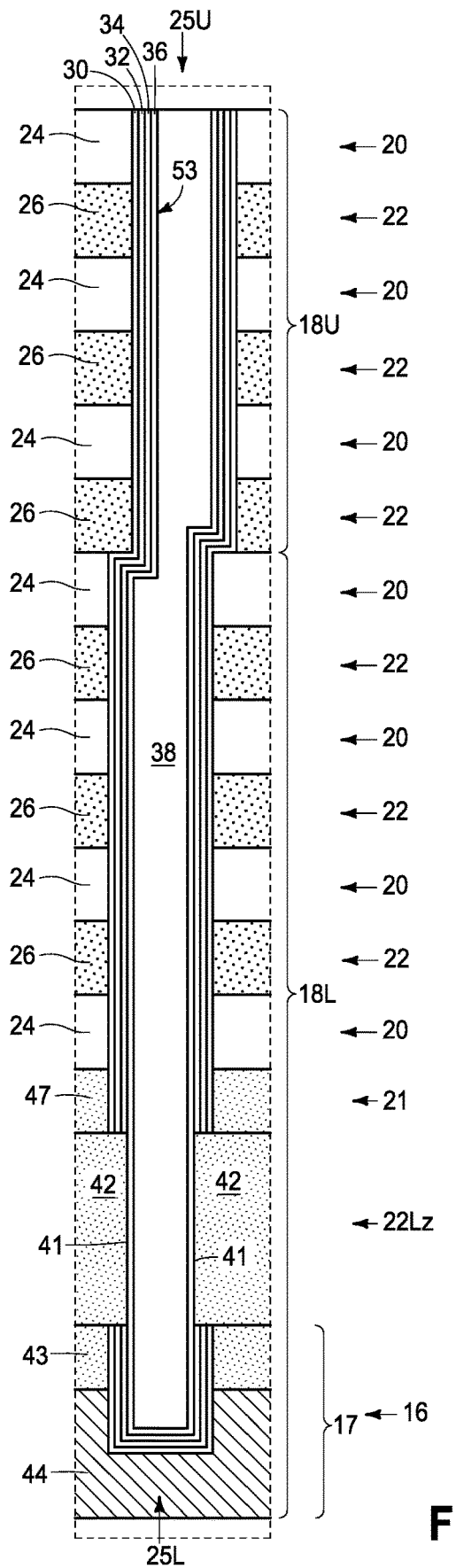

Referring to FIGS. 28-30, conductively-doped semiconductive material 42 (e.g., conductively-doped polysilicon) has been formed in lowest first tier 22Lz. Conductively-doped semi conductive material 42 thereby directly electrically couples together channel material 36 of individual channel-material strings 53 and conductor material 17 of conductor tier 16. Subsequently, and by way of example, conductive material 42 has been removed from trenches 40 as has sacrificial liner 78 (not shown). Sacrificial liner 78 may be removed before forming conductive material 42 (not shown).

Referring to FIGS. 31-38, material 26 (not shown) of conductive tiers 22U/22L has been removed, for example by being isotropically etched away through trenches 40U/40L ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22U/22L in the example embodiment is sacrificial and has been replaced with conducting material 48, and which has thereafter been removed from trenches 40U/40L, thus forming individual conductive lines 29 (e.g., wordlines) and elevationally-extending strings 49 of individual transistors and/or memory cells 56.

Figure 31:
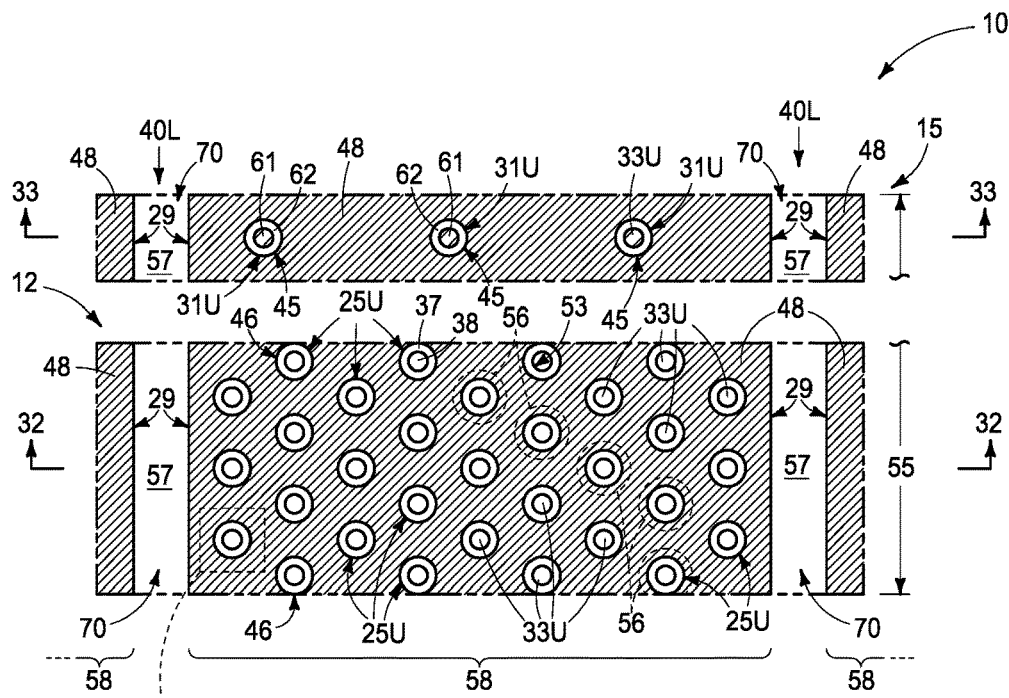
Figure 32:
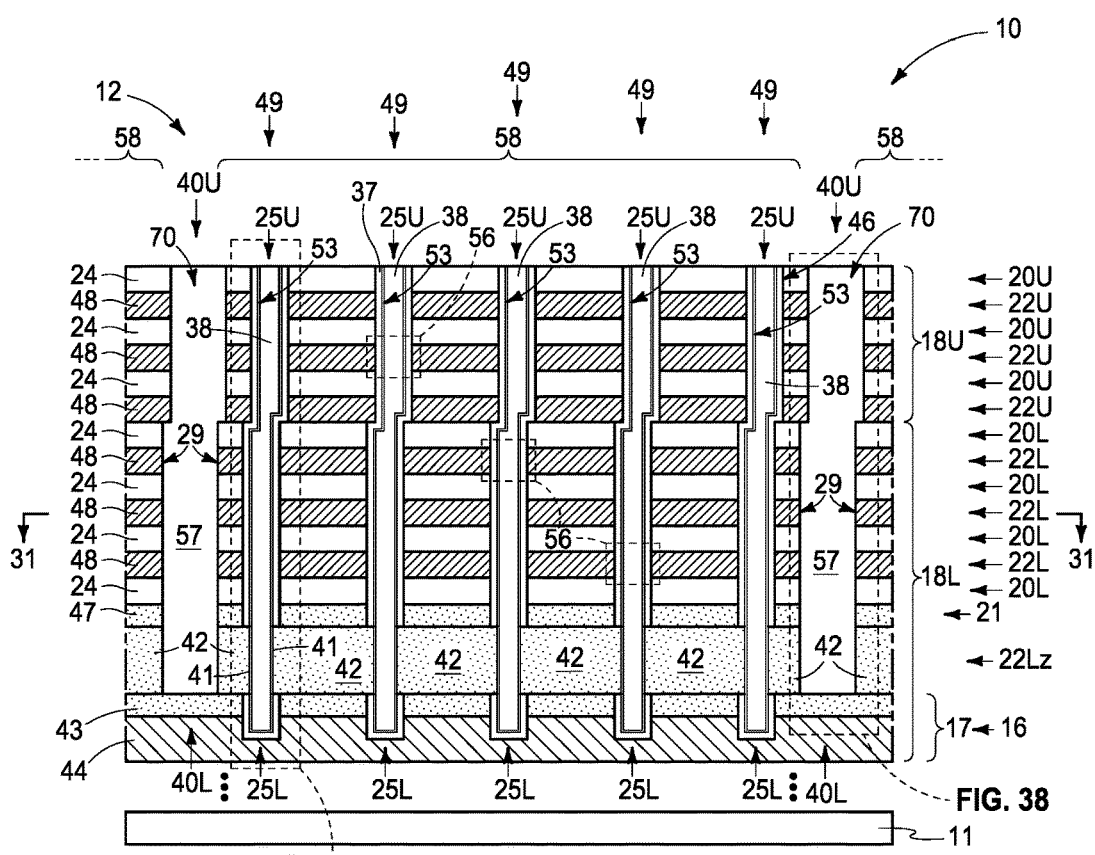
Figure 33:
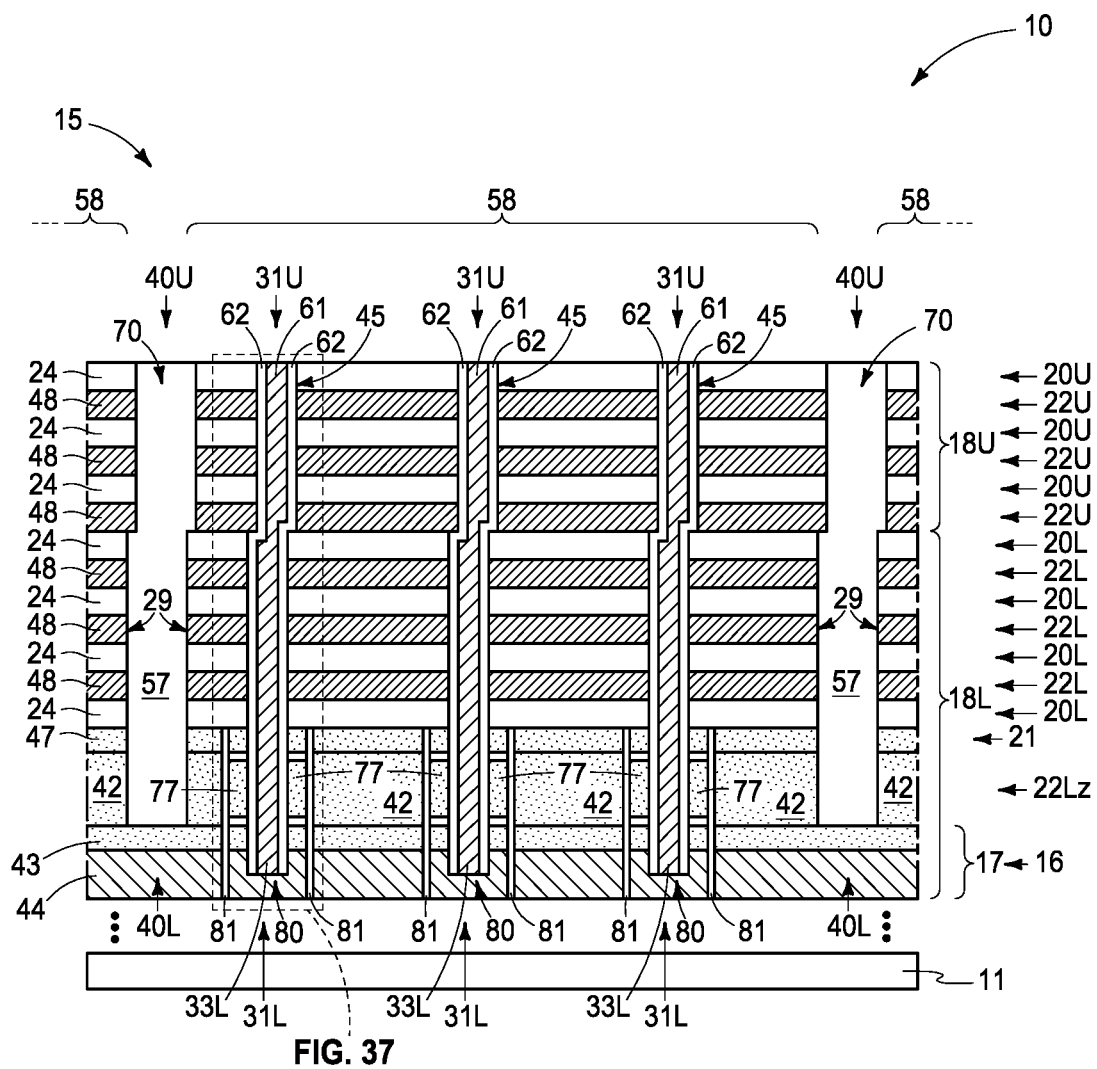
Figure 34:
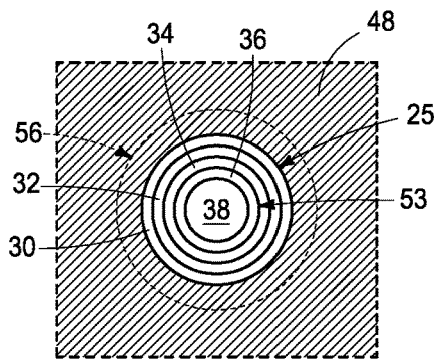
Figure 35:
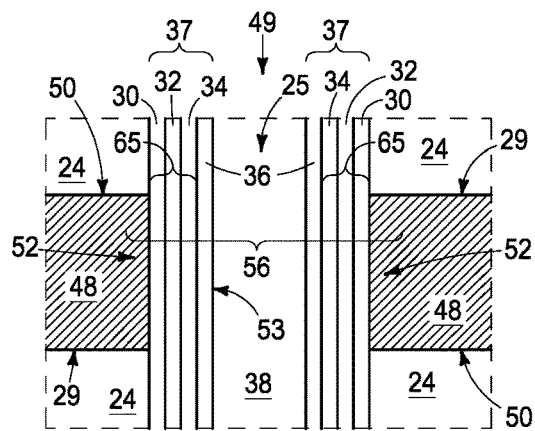
Figure 36:
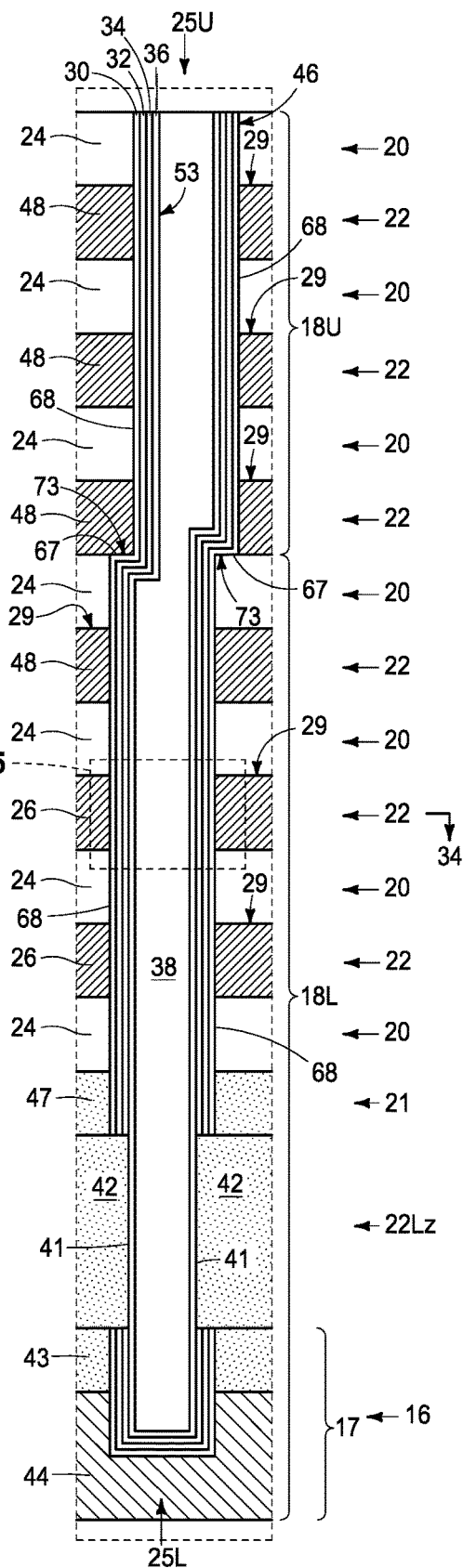
Figure 37:
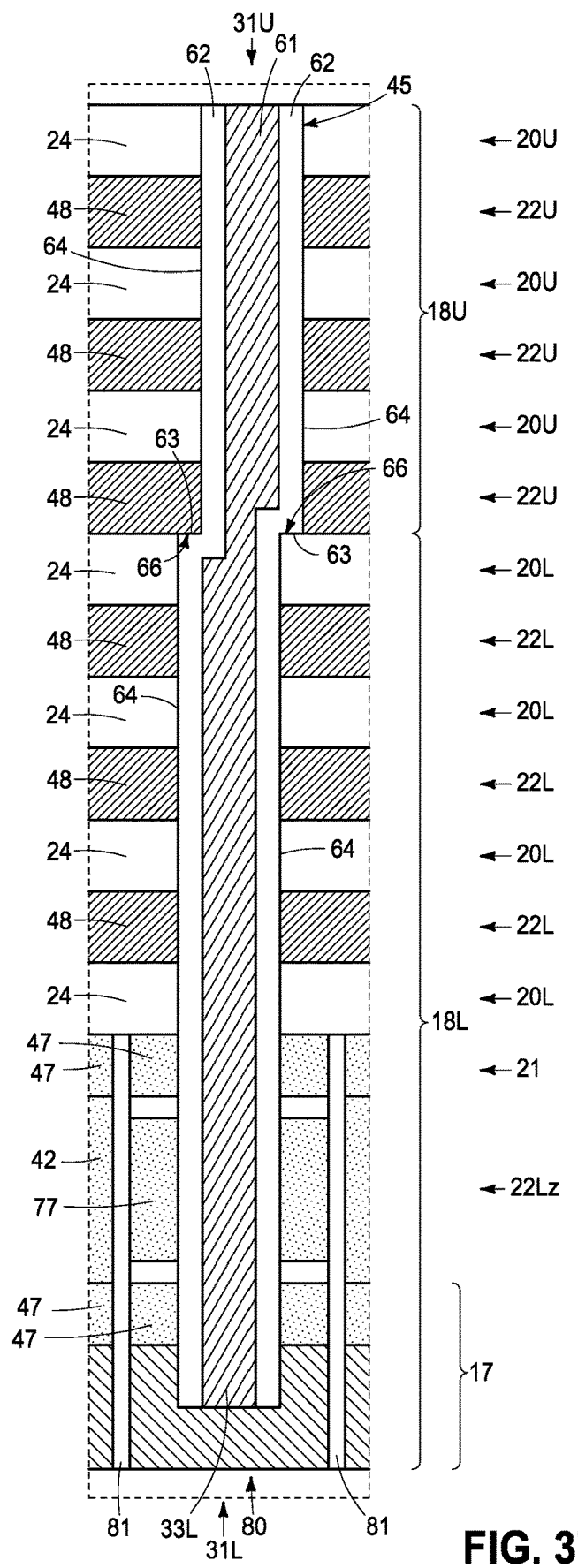
Figure 38:
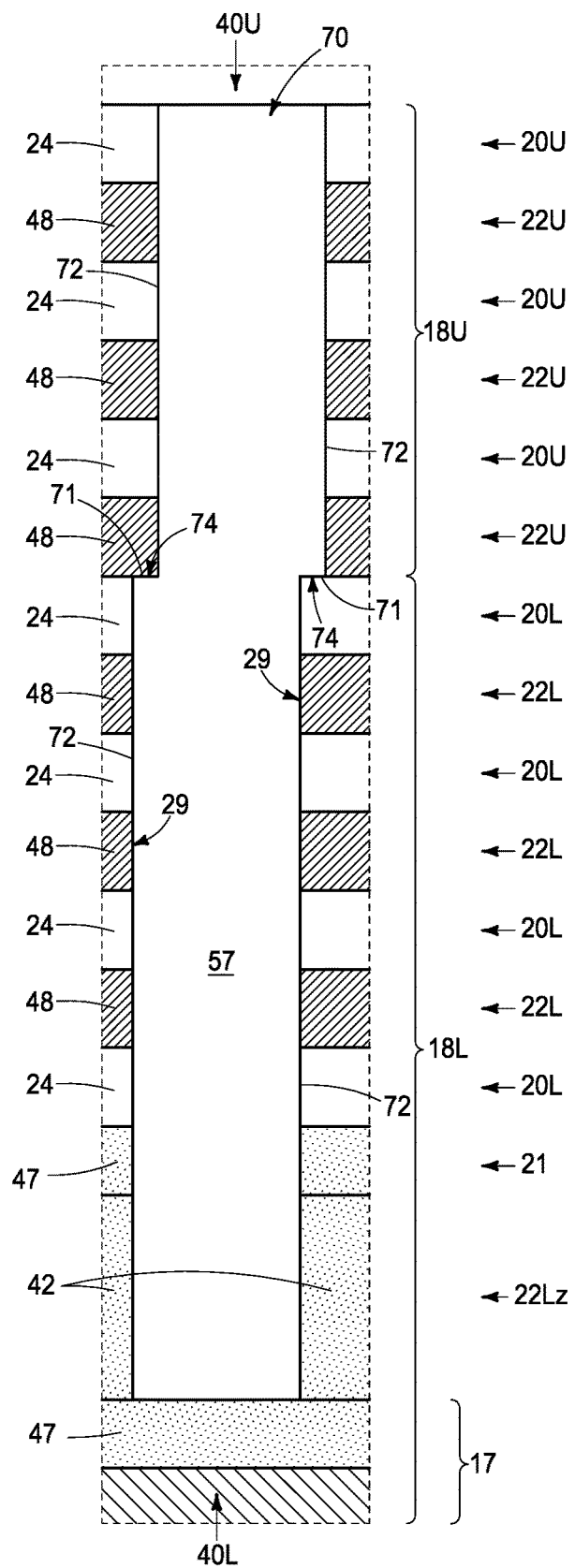

A thin insulative liner (e.g., $Al_2O_3$ and not shown) may be formed before forming conducting material 48, Approximate locations of transistors and/or memory cells 56 are indicated with a bracket in FIG. 35 and some with dashed outlines in FIGS. 31, 32, and 34, with transistors and/or memory cells 56 being essentially ring-like or annular in the depicted example. Alternately, transistors and/or memory cells 56 may not be completely encircling relative to individual channel openings 25U/25L such that each channel opening 25U/25L may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 35) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22U/22L is formed after forming channel openings 25U/25L and/or trenches 40U/40L. Alternately, the conducting material of the conductive tiers may be formed before forming channel openings 25U/25L and/or trenches 40U/40L (not shown), for example with respect to "gate-first" processing.

A charge-blocking region charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide. Example channel materials 36 include appropriately-doped crystalline semiconductor material, such as one or more silicon, germanium, and so-called semiconductor materials (e.g., GaAs, InP, GaP, and GaN).

Intervening material 57 has been formed in extended trenches 40U/40L and thereby laterally-between and longitudinally-along immediately-laterally-adjacent memory-block regions 58. Intervening material 57 may provide lateral electrical isolation (insulation) between immediately-laterally-adjacent memory blocks. Such may include one or more of insulative, semi conductive, and conducting materials and, regardless, may facilitate conductive, tiers 22U/22L from shorting relative one another in a finished circuitry construction. Example insulative materials are one or more of $SiO_2$, $Si_3N_4$, $Al_2O_3$, and undoped polysilicon. Intervening material 57 may include TAVs.

Subsequent processing may occur that is not material to aspects of the inventions disclosed herein.

In one embodiment, conductive material 61 in extended TAV openings 31U/31L (with liner 62 therein, when present) comprises TAV structures 45 extending through first tiers 20* and second tiers 22* (an * being used as a suffix to be inclusive of all such same-numerically-designated components that may or may not have other suffixes). Individual TAV structures 45 comprise an upper portion (e.g., that in upper stack 18U) above and joined with a lower portion (e.g., that in lower stack 18L), with individual TAV structures comprising at least one external jog surface 63 (FIG. 37) in a vertical cross-section (e.g., that of FIGS. 33 and 37) where the upper and lower portions join (e.g., two jog surfaces 63 being shown in the vertical cross-section). In this document, a "jog surface" is characterized or defined by an abrupt change in direction [at least 15°] in comparison to surfaces that are immediately-above and immediately-below the jog surface. In one such embodiment and as shown, individual TAV structures 45 have external sidewall surfaces 64 (FIG. 37) that are straight through multiple of the first tiers 20* and multiple of the second tiers 22* in the vertical cross-section above and below the at least one external jog surface 63. Regardless, in one embodiment, the at least one jog surface 63 includes a part 66 that is horizontal and in one such embodiment as shown that is exactly horizontal.

In one embodiment, channel-material strings 53 comprise part of channel-material-string structures 46 that extend through insulative tiers 20* and conductive tiers 22*. Channel-material-string structures 46 individually comprise an upper portion (e.g., that in upper stack 18U) above and joined with a lower portion (e.g., that in lower stack 18L), with individual channel-material-string structures 46 comprising at least one external jog surface 67 in a vertical cross-section (e.g., that of FIGS. 33 and 36) where the upper and lower portions of individual channel-material-string structures 46 join (e.g., two jog surfaces 67 being shown in the vertical cross-section). In one such embodiment and as shown, individual channel-material-string structures 46 have external sidewall surfaces 68 that are straight through multiple of the second tiers 20* and multiple of the first tiers 22* in the vertical cross-section above and below its at least one external jog surface 67. Regardless, in one embodiment, the at least one jog surface 67 includes a part 73 that is horizontal and in one such embodiment as shown that is exactly horizontal.

In one embodiment, horizontally-elongated walls 70 (e.g., comprising intervening material 57) are laterally-between immediately-laterally-adjacent memory-block regions 58. Individual horizontally-elongated walls 70 comprise an upper portion (e.g., that in upper stack 18U) above and joined with a lower portion (e.g., that in lower stack 18L), with individual walls 70 comprising at least one external jog surface 71 in a vertical cross-section (e.g., that of FIGS. 33 and 38) where the upper and lower portions of individual horizontally-elongated walls 70 join (e.g., two jog surfaces 71 being shown in the vertical cross-section). In one such embodiment and as shown, individual horizontally-elongated walls 70 have external sidewall surfaces 72 that are straight through multiple of the second tiers 20* and multiple of the conductive tiers 22* in the vertical cross-section above and below its at least one external jog surface 71. Regardless, in one embodiment, the at least one jog surface 71 includes a part 74 that is horizontal and in one such embodiment as shown that is exactly horizontal.

The above example described processing forms intervening material 57, channel-material strings 53, and conductive material 61 at different times relative one another. Channel-material strings 53 have been formed before the forming of intervening material 57 and before the forming of conductive material 61, with conductive material 61 being formed before forming intervening material 57. Alternately, conductive material 61 may be formed after forming intervening material 57. Further alternately, conductive material 61 may be formed before the forming of intervening material 57 and before the forming of channel-material strings 53, with the forming of channel-material strings 53 occurring before or after forming intervening material 57. Still further alternately, intervening material 57 may be formed before the forming of conductive material 61 and before the forming of channel-material strings 53, with the forming of channel-material strings 53 occurring before or after forming conductive material 61.

Any other attribute(s) or aspects) shown and/or described herein with respect to other embodiments may be used in the embodiments shown and described with reference to the above embodiments.

In some embodiments, a method used in forming a memory array (e.g., 12) comprising strings (e.g., 49) of memory cells (e.g., 56) comprises forming a stack (e.g., 18*) comprising vertically-alternating first tiers (e.g., 22*) and second tiers (e.g., 20*). The stack comprising laterally-spaced memory-block regions (e.g., 58). Processing with respect to (a), (b), and (c) occurs simultaneously, where, (a): forming horizontally-elongated trenches (e.g., 40) into the stack laterally-between immediately-laterally-adjacent of the memory-block regions;

(b): forming channel openings (e.g., 25U/25L) into the stack laterally-between the horizontally-elongated trenches; and (c): through-array-via (TAV) (e.g., 31U/31L) openings into the stack in a stair-step region (e.g., 15).

Intervening material (e.g., 57) is in the horizontally-elongated trenches. A channel-material string (e.g., 53) is in individual of the channel openings. Conductive material (e.g., 61) is in the TAV openings. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent, of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises laterally-spaced memory blocks (e.g., 58) individually comprising a vertical stack (e.g., 18*) comprising alternating insulative tiers (e.g., 20*) and conductive tiers (e.g., 22*). Channel-material-string structures (e.g., 46) of memory cells (e.g., 56) extend through the insulative tiers and the conductive tiers. Through-array-via (TAV) structures (e.g., 45) extend through the insulative tiers and the conductive tiers. Individual of the TAV structures comprise an upper portion above and joined with a lower portion. The individual TAV structures comprise at least one external jog surface (e.g., 63) in a vertical cross-section where the upper and lower portions join. Any other attribute(s) or aspect(s) as shown and/or described herein with respect to other embodiments may be used.

In one embodiment, a memory array (e.g., 12) comprising strings (e.g., 49) of memory cells (e.g., 56) comprises laterally-spaced memory blocks (e.g., 58) individually comprising a vertical stack (e.g., 18*) comprising alternating insulative tiers (e.g., 20*) and conductive tiers (e.g., 22*). Channel-material-string structures (e.g., 46) of memory cells (e.g., 56) extending through the insulative tiers and the conductive tiers. Through-array-via (TAV) structures (e.g., 45) extend through the insulative tiers and the conductive tiers. Individual of the TAV structures comprise an upper portion above and joined with a lower portion. The individual TAV structures comprise at least one external jog surface (e.g., 63) in a vertical cross-section where the upper and lower portions of the individual TAV structures join. Channel-material-string structures (e.g., 46) extend through the insulative tiers and the conductive tiers. Individual of the channel-material-string structures comprise an upper portion above and joined with a lower portion. The individual channel-material-string structures comprise at least one external jog surface e.g., 67) in the vertical cross-section where the upper and lower portions of the individual channel-material-string structures join. Horizontally-elongated walls (e.g., 70) are laterally-between immediately-laterally-adjacent of the memory blocks. Individual of the horizontally-elongated walls comprising an upper portion above and joined with a lower portion. The individual walls comprising at least one external jog surface (e.g., 71) in the vertical cross-section where the upper and lower portions of the horizontally-elongated walls join. Any other attribute(s) aspect(s) as shown and/or described herein with respect to other embodiments may be used.

Processing as described above may result in reduction of one or more masking steps and deep etching associated therewith.

The above processing(s) or construction(s) may be considered as being relative to an array of components formed as or within two stacks or two decks of such components above or as part of an underlying base substrate (albeit, the two stacks/decks may each have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time. Alternately, the processing(s) or construction(s) may be with respect to a single stack or single deck above or part of an underlying base substrate.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above". "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a stack comprising vertically-alternating first tiers and second tiers. The stack comprises laterally-spaced memory-block regions. Simultaneously, (a), (b), and (c) are formed, where (a): horizontally-elongated trenches into the stack laterally-between immediately-laterally-adjacent of the memory-block regions; (b): channel openings into the stack laterally-between the horizontally-elongated trenches; and (c): through-array-via (TAV) openings into the stack in a stair-step region. Intervening material is formed in the horizontally-elongated trenches, a channel-material string in individual of the channel openings, and conductive material in the TAN openings.

In some embodiments, a method used in forming a memory array, comprising strings of memory cells comprises forming a lower stack comprising vertically-alternating lower first tiers and lower second tiers. The lower stack comprises laterally-spaced memory-block regions. Simultaneously, (a), (b), and (c) are formed, where (a): horizontally-elongated lower trenches into the lower stack laterally-between immediately-laterally-adjacent of the memory-block regions; (b): lower channel openings into the lower stack laterally-between the horizontally-elongated lower trenches; and (c): lower through-array-via TAV) openings into the lower stack in a stair-step region. First sacrificial material is formed in that which was formed by the (a), the (b), and the (c). An upper stack is formed directly above the lower stack and the first sacrificial material. The upper stack comprises vertically-alternating upper first tiers and upper second tiers. The upper stack comprises the laterally-spaced memory-block regions. (d), (e), and (f) are formed, where (d): horizontally-elongated upper trenches into the upper stack laterally-between immediately-laterally-adjacent of the memory-block regions, individual of the horizontally-elongated upper trenches extending to the first sacrificial material in individual of the horizontally-elongated lower trenches; (e): upper channel openings into the upper stack laterally-between the horizontally-elongated upper trenches, individual of the upper channel openings extending to the first sacrificial material in individual of the lower channel openings; and (f): upper TAV openings into the upper stack in the stair-step region, individual of the upper TAV openings extending to the first sacrificial material in individual of the lower TAV openings. Second sacrificial material is formed in that which was formed by the (d), the (e), and the (f). The first and second sacrificial materials are removed to form upwardly-open vertically-extended trenches, upwardly-open vertically-extended channel openings, and upwardly-open vertically-extended TAV openings. Intervening material is formed in the upwardly-open vertically-extended horizontally-elongated trenches, a channel-material string in individual of the upwardly-open vertically-extended channel openings, and conductive material in the upwardly-open vertically-extended TAV openings.

In some embodiments, a memory array comprising strings of memory cells comprises laterally-spaced memory blocks individually comprising a vertical stack comprising alternating insulative tiers and conductive tiers. Channel-material-string structures of memory cells extend through the insulative tiers and the conductive tiers, Through-array-via (TAV) structures extend through the insulative tiers and the conductive tiers. Individual of the TAV structures comprise an upper portion above and joined with a lower portion. The individual TAV structures comprise at least one external jog surface in a vertical cross-section where the upper and lower portions join.

In some embodiments, a memory array comprising strings of memory cells comprises laterally-spaced memory blocks individually comprising a vertical stack comprising alternating insulative tiers and conductive tiers. Channel-material-string structures of memory cells extend through the insulative tiers and the conductive tiers. Through-array-via (TAV) structures extend through the insulative tiers and the conductive tiers. Individual of the TAV structures comprise an upper portion above and joined with a lower portion. The individual TAV structures comprise at least one external jog surface in a vertical cross-section where the upper and lower portions of the individual TAV structures join. Channel-material-string structures extend through the insulative tiers and the conductive tiers. Individual of the channel-material-string structures comprise an upper portion above and joined with a lower portion. The individual channel-material-string structures comprise at least one external jog surface in the vertical cross-section where the upper and lower portions of the individual channel-material-string structures join. Horizontally-elongated walls are laterally-between immediately-laterally-adjacent of the memory blocks. Individual of the horizontally-elongated walls comprise an upper portion above and joined with a lower portion. The individual walls comprise at least one external jog surface in the vertical cross-section where the upper and lower portions of the horizontally-elongated walls join.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
 forming a stack comprising vertically-alternating first tiers and second tiers, the stack comprising laterally-spaced memory-block regions;
 simultaneously forming (a), (b), and (c), where,
  (a): horizontally-elongated trenches into the stack laterally-between immediately-laterally-adjacent of the memory-block regions;
  (b): channel openings into the stack laterally-between the horizontally-elongated trenches; and
  (c): through-array-via (TAV) openings into the stack in a stair-step region; and
 forming intervening material in the horizontally-elongated trenches, a channel-material string in individual of the channel openings, and conductive material in the TAV openings.

2. The method of claim 1 comprising forming the intervening material, the channel-material strings, and the conductive material at different times relative one another; the channel-material strings being formed before the forming of the intervening material and before the forming of the conductive material.

3. The method of claim 2 comprising forming the conductive material before forming the intervening material.

4. The method of claim 2 comprising forming the conductive material after forming the intervening material.

5. The method of claim 1 comprising forming the intervening material, the channel-material strings, and the conductive material at different times relative one another; the conductive material being formed before the forming of the intervening material and before the forming of the channel-material strings.

6. The method of claim 5 comprising forming the channel-material strings before forming the intervening material.

7. The method of claim 5 comprising forming the channel-material strings after forming the intervening material.

8. The method of claim 1 comprising forming the intervening material, the channel-material strings, and the conductive material at different times relative one another; the intervening material being formed before the forming of the conductive material and before the forming of the channel-material strings.

9. The method of claim 8 comprising forming the channel-material strings before forming the conductive material.

10. The method of claim 8 comprising forming the channel-material strings after forming the conductive material.

11. The method of claim 1 wherein the conductive material in the TAV openings comprises TAV structures extending through the first tiers and the second tiers, individual of the TAV structures comprising an upper portion above and joined with a lower portion, the individual TAV structures comprising at least one external jog surface in a vertical cross-section where the upper and lower portions join.

12. The method of claim 11 wherein the individual TAV structures have external sidewall surfaces that are straight through multiple of the first tiers and multiple of the second tiers in the vertical cross-section above and below the at least one external jog surface.

13. A method used in forming a memory array comprising strings of memory cells, comprising:
 forming a lower stack comprising vertically-alternating lower first tiers and lower second tiers, the lower stack comprising laterally-spaced memory-block regions;
 simultaneously forming (a), (b), and (c), where,
  (a): horizontally-elongated lower trenches into the lower stack laterally-between immediately-laterally-adjacent of the memory-block regions;
  (b): lower channel openings into the lower stack laterally-between the horizontally-elongated lower trenches; and
  (c): lower through-array-via (TAV) openings into the lower stack in a stair-step region;
 forming first sacrificial material in that which was formed by the (a), the (b), and the (c);
 forming an upper stack directly above the lower stack and the first sacrificial material, the upper stack comprising vertically-alternating upper first tiers and upper second tiers, the upper stack comprising the laterally-spaced memory-block regions;

forming (d), (e), and (f), where,
- (d): horizontally-elongated upper trenches into the upper stack laterally-between immediately-laterally-adjacent of the memory-block regions, individual of the horizontally-elongated upper trenches extending to the first sacrificial material in individual of the horizontally-elongated lower trenches;
- (e): upper channel openings into the upper stack laterally-between the horizontally-elongated upper trenches, individual of the upper channel openings extending to the first sacrificial material in individual of the lower channel openings; and
- (f): upper TAV openings into the upper stack in the stair-step region, individual of the upper TAV openings extending to the first sacrificial material in individual of the lower TAV openings;

forming second sacrificial material in that which was formed by the (d), the (e), and the (f);

removing the first and second sacrificial materials to form upwardly-open vertically-extended trenches, upwardly-open vertically-extended channel openings, and upwardly-open vertically-extended TAV openings; and forming intervening material in the upwardly-open vertically-extended trenches, a channel-material string in individual of the upwardly-open vertically-extended channel openings, and conductive material in the upwardly-open vertically-extended TAV openings.

14. The method of claim 13 wherein the (d), the (e), and the (f) are formed simultaneously.

15. The method of claim 13 wherein the (d), the (e), and the (f) are not formed simultaneously.

16. The method of claim 15 comprising forming the (e) before the forming of the (d) and the (f).

17. The method of claim 16 comprising forming the (f) before the forming of the (d).

18. The method of claim 16 wherein the conductive material in the upwardly-open vertically-extended TAV openings comprises TAV structures extending through the upper first tiers, the upper second tiers, the lower first tiers and the lower second tiers; individual of the TAV structures comprising at least one external jog surface in a vertical cross-section where the upper and lower stacks join.

19. The method of claim 18,
wherein the individual TAV structures have external sidewall surfaces that are straight through multiple of the upper first tiers and multiple of the upper second tiers in the vertical cross-section above the at least one external jog surface;
forming the channel-material strings to comprise part of channel-material-string structures that extend through the upper and lower first tiers and the upper and lower second tiers, individual of the channel-material-string structures comprising an upper portion above and joined with a lower portion, the individual channel-material-string structures comprising at least one external jog surface in the vertical cross-section where the upper and lower portions of the individual channel-material-string structures join, the individual channel-material-string structures have external sidewall surfaces that are straight through multiple of the upper and lower first tiers and multiple of the upper and lower second tiers in the vertical cross-section above and below its at least one external jog surface; and horizontally-elongated walls being laterally-between immediately-laterally-adjacent of the laterally-spaced memory-block regions, individual of the horizontally-elongated walls comprising an upper portion above and joined with a lower portion, the individual horizontally-elongated walls comprising at least one external jog surface in the vertical cross-section where the upper and lower portions of the horizontally-elongated walls join, the individual horizontally-elongated walls have external sidewall surfaces that are straight through multiple of the upper and lower first tiers and multiple of the upper and lower second tiers in the vertical cross-section above and below its at least one external jog surface.

20. A memory array comprising strings of memory cells, comprising:
laterally-spaced memory blocks individually comprising a vertical stack comprising alternating insulative tiers and conductive tiers, channel-material-string structures of memory cells extending through the insulative tiers and the conductive tiers; and
through-array-via (TAV) structures extending through the insulative tiers and the conductive tiers, individual of the TAV structures comprising an upper portion above and joined with a lower portion, the individual TAV structures comprising at least one external jog surface in a vertical cross-section where the upper and lower portions join.

21. The memory array of claim 20 wherein the individual TAV structures have external sidewall surfaces that are straight through multiple of the insulative tiers and multiple of the conductive tiers in the vertical cross-section above and below the at least one external jog surface.

22. The memory array of claim 20 wherein the at least one external jog surface includes a part that is horizontal.

23. The memory array of claim 22 wherein the part is exactly horizontal.

24. The memory array of claim 22 wherein the individual TAV structures have external sidewall surfaces that are straight through multiple of the insulative tiers and multiple of the conductive tiers in the vertical cross-section above and below the at least one external jog surface.

25. The memory array of claim 24 wherein the part is exactly horizontal.

26. The memory array of claim 20 comprising NAND.

27. A memory array comprising strings of memory cells, comprising:
laterally-spaced memory blocks individually comprising a vertical stack comprising alternating insulative tiers and conductive tiers, channel-material-string structures of memory cells extending through the insulative tiers and the conductive tiers;
through-array-via (TAV) structures extending through the insulative tiers and the conductive tiers, individual of the TAV structures comprising an upper portion above and joined with a lower portion, the individual TAV structures comprising at least one external jog surface in a vertical cross-section where the upper and lower portions of the individual TAV structures join;
individual of the channel-material-string structures comprising an upper portion above and joined with a lower portion, the individual channel-material-string structures comprising at least one external jog surface in the vertical cross-section where the upper and lower portions of the individual channel-material-string structures join; and horizontally-elongated walls laterally-between immediately-laterally-adjacent of the memory blocks, individual of the horizontally-elongated walls comprising an upper portion above and joined with a lower portion, the individual horizontally-elongated walls comprising at least one external jog surface in the vertical cross-section where the upper and lower portions of the horizontally-elongated walls join.

28. The memory array of claim 27 wherein, the individual TAV structures have external sidewall surfaces that are straight through multiple of the insulative tiers and multiple of the conductive tiers in the vertical cross-section above and below its at least one external jog surface;

the individual channel-material-string structures have external sidewall surfaces that are straight through multiple of the insulative tiers and multiple of the conductive tiers in the vertical cross-section above and below its at least one external jog surface; and the individual horizontally-elongated walls have external sidewall surfaces that are straight through multiple of the insulative tiers and multiple of the conductive tiers in the vertical cross-section above and below its at least one external jog surface.

29. The memory array of claim 27 comprising NAND.

\* \* \* \* \*